US011884853B2

United States Patent
Stubbs et al.

(10) Patent No.: US 11,884,853 B2
(45) Date of Patent: Jan. 30, 2024

(54) ELECTROLUMINESCENT DISPLAY DEVICES AND METHODS OF MAKING THE SAME

(71) Applicant: KYULUX, INC., Fukuoka (JP)

(72) Inventors: Stuart Stubbs, Manchester (GB); Nathalie Gresty, Manchester (GB); James Harris, Manchester (GB); Yu Seok Yang, Fukuoka (JP); Shuo-Hsien Cheng, Fukuoka (JP); Ayataka Endo, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 94 days.

(21) Appl. No.: 17/294,618

(22) PCT Filed: Oct. 30, 2019

(86) PCT No.: PCT/GB2019/053062
§ 371 (c)(1),
(2) Date: May 17, 2021

(87) PCT Pub. No.: WO2020/099826
PCT Pub. Date: May 22, 2020

(65) Prior Publication Data
US 2022/0010203 A1    Jan. 13, 2022

Related U.S. Application Data

(60) Provisional application No. 62/768,531, filed on Nov. 16, 2018.

(51) Int. Cl.
*C09K 11/06*    (2006.01)
*C09K 11/02*    (2006.01)
(Continued)

(52) U.S. Cl.
CPC .............. *C09K 11/06* (2013.01); *C09K 11/02* (2013.01); *C09K 11/565* (2013.01);
(Continued)

(58) Field of Classification Search
CPC ....... C09K 11/06; C09K 11/02; C09K 11/565; C09K 11/883; C09K 2211/1007; H10K 50/115; H10K 2101/20
See application file for complete search history.

(56) References Cited

U.S. PATENT DOCUMENTS 10,497,890 B2    12/2019   He
11,450,807 B2 *   9/2022   Zhang ................ H10K 85/6572
(Continued)

FOREIGN PATENT DOCUMENTS

CN     102272217 A    12/2011
CN     106229423 A    12/2016
(Continued)

OTHER PUBLICATIONS

International Preliminary Report on Patentability of Chapter I for PCT International Application No. PCT/GB2019/053062, dated May 18, 2021.
(Continued)

*Primary Examiner* — C Melissa Koslow
(74) *Attorney, Agent, or Firm* — BROWDY AND NEIMARK, PLLC

(57) ABSTRACT

A nanoparticle conjugate includes a quantum dot (QD) and a thermally activated delayed fluorescence (TADF) molecule bound to the QD. In some instances, the TADF molecule can be directly bound to a surface of the QD. In other instances, the TADF molecule can be indirectly bound to the QD via an interaction with one or more capping ligands disposed on a surface of the QD. Nanoparticle conjugates described herein can be incorporated into emissive layers of electroluminescent light-emitting diode devices to yield electroluminescent quantum dot-containing light-emitting diode (QD-LED) devices.

19 Claims, 9 Drawing Sheets

(51) Int. Cl.
  *C09K 11/56* (2006.01)
  *C09K 11/88* (2006.01)
  *H10K 50/115* (2023.01)
  *B82Y 20/00* (2011.01)
  *B82Y 40/00* (2011.01)
  *H10K 101/20* (2023.01)

(52) U.S. Cl.
  CPC .......... *C09K 11/883* (2013.01); *H10K 50/115* (2023.02); *B82Y 20/00* (2013.01); *B82Y 40/00* (2013.01); *C09K 2211/1007* (2013.01); *H10K 2101/20* (2023.02)

(56) References Cited

U.S. PATENT DOCUMENTS

| | | |
|---|---|---|
| 2010/0113813 A1 | 5/2010 | Pickett et al. |
| 2013/0063023 A1 | 3/2013 | Pan et al. |
| 2017/0186986 A1 | 6/2017 | Lee et al. |
| 2018/0053907 A1 | 2/2018 | He et al. |
| 2019/0115555 A1 | 4/2019 | He |

FOREIGN PATENT DOCUMENTS

| | | |
|---|---|---|
| CN | 109180853 * | 1/2019 |
| EP | 3309236 A1 | 4/2011 |
| TW | 200524193 A | 7/2005 |
| WO | 2018/001000 A1 | 1/2018 |

OTHER PUBLICATIONS

International Search Report and Search Opinion in PCT International Application No. PCT/GB2019/053062, dated Jan. 16, 2020.
Office Action dated Apr. 18, 2023 issued in the corresponding Chinese patent application No. 201980075359.6 with its English Machine Translation.
Office Action dated Sep. 1, 2023 issued in the corresponding Chinese patent application No. 201980075359.6 with its English Machine Translation.
Office Action dated Dec. 8, 2023 issued in the corresponding Chinese patent application No. 201980075359.6 with its English Machine Translation.

* cited by examiner

ELECTROLUMINESCENT DISPLAY DEVICES AND METHODS OF MAKING THE SAME

CROSS REFERENCE TO RELATED APPLICATION

This application claims the benefit of U.S. Provisional Application No. 62/768,531 filed Nov. 16, 2018, the entire contents of which are incorporated herein by reference.

FIELD OF THE INVENTION

The present invention relates to electroluminescent display devices and methods of making electroluminescent display devices. More particularly, the present invention relates to electroluminescent display devices which utilize an emissive layer comprising quantum dots having molecules conjugated on their surface, where the molecules exhibit thermally activated delayed fluorescence (TADF).

BACKGROUND OF THE DISCLOSURE

Semiconductor Nanomaterials

There has been substantial interest in the preparation and characterization of compound semiconductors consisting of particles with dimensions in the order of 2-100 nm, often referred to as quantum dots (QDs) and/or nanoparticles. Studies in this field have focused mainly on the size-tunable electronic, optical and chemical properties of nanoparticles. Semiconductor nanoparticles are gaining interest due to their potential in commercial applications as diverse as biological labeling, solar cells, catalysis, biological imaging, and light-emitting diodes.

Two fundamental factors (both related to the size of the individual semiconductor nanoparticles) are primarily responsible for their unique properties. The first is the large surface-to-volume ratio: as a particle becomes smaller, the ratio of the number of surface atoms to those in the interior increases. This leads to the surface properties playing an important role in the overall properties of the material. The second factor is that, for many materials (including semiconductor nanoparticles), the electronic properties of the material change with particle size. Moreover, because of quantum confinement effects, the band gap typically becomes gradually larger as the size of the nanoparticle decreases. This effect is a consequence of the confinement of an "electron in a box," giving rise to discrete energy levels similar to those observed in atoms and molecules, rather than a continuous band as observed in the corresponding bulk semiconductor material. Semiconductor nanoparticles tend to exhibit a narrow bandwidth emission that is dependent upon the particle size and composition of the nanoparticle material. The first excitonic transition (band gap) increases in energy with decreasing particle diameter.

Semiconductor nanoparticles of a single semiconductor material, referred to herein as "core nanoparticles," along with an outer organic passivating layer, tend to have relatively low quantum efficiencies due to electron-hole recombination occurring at defects and dangling bonds situated on the nanoparticle surface that can lead to non-radiative electron-hole recombinations.

One method to eliminate defects and dangling bonds on the inorganic surface of the nanoparticle is to grow a second inorganic material (typically having a wider band-gap and small lattice mismatch to that of the core material) on the surface of the core particle to produce a "core-shell" particle. Core-shell particles separate carriers confined in the core from surface states that would otherwise act as non-radiative, recombination centers. One example is ZnS grown on the surface of CdSe cores. Another approach is to prepare a core-multi shell structure where the "electron-hole" pair is completely confined to a single shell layer consisting of a few monolayers of a specific material such as a quantum dot-quantum well structure. Here, the core is typically a wide bandgap material, followed by a thin shell of narrower bandgap material, and capped with a further wide-bandgap layer. An example is CdS/HgS/CdS grown using substitution of Hg for Cd on the surface of the core nanocrystal to deposit just a few monolayers of HgS that is then overgrown by monolayers of CdS. The resulting structures exhibit clear confinement of photo-excited carriers in the HgS layer.

The most-studied and prepared semiconductor nanoparticles to date have been so-called "II-VI materials," for example, ZnS, ZnSe, CdS, CdSe, and CdTe, as well as core-shell and core-multi shell structures incorporating these materials. However, cadmium and other restricted heavy metals used in conventional QDs are highly toxic elements and are of major concern in commercial applications.

Other semiconductor nanoparticles that have generated considerable interest include nanoparticles incorporating Group III-V and Group IV-VI materials, such as GaN, GaP, GaAs, InP, and InAs. Due to their increased covalent nature, III-V and IV-VI highly crystalline semiconductor nanoparticles are more difficult to prepare and much longer annealing times are usually required. However, there are now reports of III-VI and IV-VI materials being prepared in a similar manner to that used for the II-VI materials.

Organic Light-Emitting Diodes (OLEDs)

In recent years, electroluminescent display devices, specifically organic light-emitting diodes (OLEDs), have been of great interest within the display industry. An OLED is a light-emitting diode (LED) in which a film of organic compounds is placed between two conductors, which film emits light in response to excitation, such as an electric current. OLEDs are useful in displays, such as television screens, computer monitors, mobile phones, and tablets. A problem inherent in OLED displays is the limited lifetime of the organic compounds. OLEDs which emit blue light, in particular, degrade at a significantly increased rate as compared to green or red OLEDs.

OLED materials rely on the radiative decay of molecular excited states (excitons) generated by recombination of electrons and holes in a host transport material. Two types of excited states are created when charge recombines in an OLED—bright singlet excitons (with a total spin of 0) and dark triplet excitons (with a total spin of 1)—but only the singlets directly give light which fundamentally limits external OLED efficiencies. Spin statistics states that one singlet exciton is generated for every three triplet excitons after the recombination of holes and electrons in organic semiconductor materials. The efficiency of OLEDs can therefore be substantially increased if the non-emissive triplets can be utilized.

To date, OLED material design has focused on harvesting the remaining energy from the normally dark triplets. Recent work to create efficient phosphors, which emit light from the normally dark triplet state, have resulted in green and red OLEDs. Other colors, such as blue, however, require higher energy excited states which accelerate the degradation process of the OLED.

The fundamental limiting factor to the triplet-singlet transition rate is a value of the parameter $|H_{fi}/\Delta|^2$, where $H_{fi}$ is the coupling energy due to hyperfine or spin-orbit interactions, and Δ is the energetic splitting between singlet and triplet states. Traditional phosphorescent OLEDs rely on the mixing of singlet and triplet states due to spin-orbital (SO) interaction, increasing $H_{fi}$, and affording a lowest emissive state shared between a heavy metal atom and an organic ligand. This results in energy harvesting from all higher singlet and triplet states, followed by phosphorescence (relatively short-lived emission from the excited triplet). The shortened triplet lifetime reduces triplet exciton annihilation by charges and other excitons. Recent work by others suggests that the limit to the performance of phosphorescent materials has been reached.

It is thought that the solution processability of OLED devices may lead to a low production cost once mass production has been fully established, and can enable the fabrication of devices on flexible substrates, leading to new technologies such as roll-up displays. In an OLED device, the pixels emit directly, enabling a greater contrast ratio and wider viewing angle compared to liquid crystal displays (LCDs). Further, in contrast to LCDs, OLED displays do not require a backlight, allowing a true black when the OLED is switched off. OLEDs also offer faster response times than LCDs. However, OLED devices typically suffer from poor stability and lifetimes, owing to the lifespans of the organic emissive materials. Blue OLEDs currently display much lower external quantum efficiencies than green and red OLEDs. Further, OLEDs often suffer from broad emission; for display applications narrower emission is desirable to provide better colour purity. Thus, there is a need for a solution-processable emissive device with good stability and lifetime and improved blue emission.

Molecules Exhibiting Thermally Activated Delayed Fluorescence (TADF)

It has been discovered that thermally activated delayed fluorescence (TADF), which relies on minimization of Δ as opposed to maximization of $H_{fi}$, can transfer population between singlet levels and triplet sublevels in a relevant timescale, such as, for example, 1-100 μs. OLEDs incorporating TADF molecules can reach higher excitation states without rapid degradation. The devices described herein are capable of luminescing at higher energy excitation states than devices previously described.

OLEDs are typically composed of a layer of organic materials or compounds between two electrodes, an anode and a cathode. The organic molecules are electrically conductive as a result of delocalization of a electronics caused by conjugation over part or all of the molecule. When a voltage is applied, electrons from the highest occupied molecular orbital (HOMO) present at the anode flow into the lowest unoccupied molecular orbital (LUMO) of the organic molecules present at the cathode. Removal of electrons from the HOMO is also referred to as inserting electron holes into the HOMO. Electrostatic forces bring the electrons and the holes towards each other until they recombine and form an exciton (which is the bound state of the electron and the hole). As the excited state decays and the energy levels of the electrons relax, radiation having a frequency in the visible spectrum is emitted. The frequency of this radiation depends on the band gap of the material, which is the difference in energy between the HOMO and the LUMO.

Because electrons and holes are fermions with half integer spin, an exciton may either be in a singlet state or a triplet state depending on how the spins of the electron and hole have been combined. Statistically, three triplet excitons will be formed for each singlet exciton. Decay from triplet states is spin forbidden, which results in increases in the timescale of the transition and limits the internal efficiency of fluorescent devices.

Thermally activated delayed fluorescence (TADF) seeks to minimize energetic splitting between singlet and triplet states (Δ). The reduction in exchange splitting from typical values of 0.4-0.7 eV to a gap of the order of the thermal energy (proportional to $k_B T$, where $k_B$ is the Boltzmann constant, and T is temperature) means that thermal agitation can transfer population between singlet levels and triplet sublevels in a relevant timescale even if the coupling between states is small.

TADF molecules consist of donor and acceptor moieties connected directly by a covalent bond or via a conjugated linker (or "bridge"). A "donor" moiety is likely to transfer electrons from its HOMO upon excitation to the "acceptor" moiety. An "acceptor" moiety is likely to accept the electrons from the "donor" moiety into its LUMO. The donor-acceptor nature of TADF molecules results in low-lying excited states with charge-transfer character that exhibit very low Δ. Since thermal molecular motions can randomly vary the optical properties of donor-acceptor systems, a rigid three-dimensional arrangement of donor and acceptor moieties can be used to limit the non-radiative decay of the charge-transfer state by internal conversion during the lifetime of the excitation.

It is beneficial, therefore, to decrease energetic splitting between singlet and triplet states (Δ), and to create a system with increased reversed intersystem crossing (RISC) capable of exploiting triplet excitons. Such a system may result in decreased emission lifetimes. Systems with these features may be capable of emitting blue light without being subject to the rapid degradation prevalent in blue OLEDs of the prior art.

DETAILED DESCRIPTION

Figure 1:
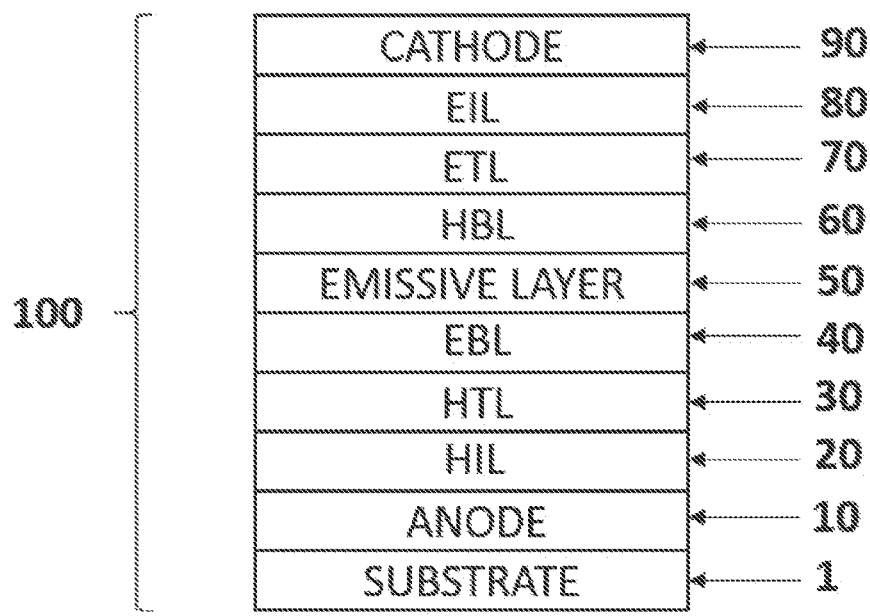
FIG. 1 is a schematic illustration of an exemplary electroluminescent quantum dot-containing light-emitting diode (QD-LED) device structure in accordance with various aspects of the present disclosure.

The following description of the embodiments is merely exemplary in nature and is in no way intended to limit the subject matter of the present disclosure, their application, or uses.

As used throughout, ranges are used as shorthand for describing each and every value that is within the range. Any value within the range can be selected as the terminus of the range. Unless otherwise specified, all percentages and amounts expressed herein and elsewhere in the specification should be understood to refer to percentages by weight.

For the purposes of this specification and appended claims, unless otherwise indicated, all numbers expressing quantities, percentages or proportions, and other numerical values used in the specification and claims, are to be understood as being modified in all instances by the term "about." The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent, alternatively ±5 percent, and alternatively ±1 percent of the given numeric value provided such a deviation does not alter the end function or result of the value. Accordingly, unless indicated to the contrary, the numerical parameters set forth in this specification and attached claims are approximations that can vary depending upon the desired properties sought to be obtained by the present invention.

It is noted that, as used in this specification and the appended claims, the singular forms "a," "an," and "the," include plural references unless expressly and unequivocally limited to one referent. As used herein, the term "include" and its grammatical variants are intended to be non-limiting, such that recitation of items in a list is not to the exclusion of other like items that can be substituted or added to the listed items. For example, as used in this specification and the following claims, the terms "comprise" (as well as forms, derivatives, or variations thereof, such as "comprising" and "comprises"), "include" (as well as forms, derivatives, or variations thereof, such as "including" and "includes") and "has" (as well as forms, derivatives, or variations thereof, such as "having" and "have") are inclusive (i.e., open-ended) and do not exclude additional elements or steps. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

FIG. 1 is a schematic illustration of an exemplary electroluminescent quantum dot-containing light-emitting diode (QD-LED) device structure. The QD-LED 100 includes a substrate 1, an anode 10, a hole injection layer (HIL) 20, a hole transport layer (HTL) 30, an electron blocking layer (EBL) 40, an emissive layer 50, a hole blocking layer (HBL) 60, an electron transport layer (ETL) 70, and electron injection layer (EIL) 80 and a cathode 90. The QD-LED device structure of FIG. 1 can contain additional layers or omit one or more of the shown layers. Traditional OLED devices may comprise a similar structure, wherein the emissive layer 50 comprises a fluorescent material, usually an organic fluorophore, dispersed in a host matrix. In accordance with various aspects of the present disclosure, a population quantum dots (QDs) are utilized as the fluorescent material, wherein the quantum dots have molecules exhibiting thermally activated delayed fluorescence (TADF molecules) conjugated to their surface, forming QD-TADF conjugates. The TADF molecules can be directly or indirectly conjugated to surfaces of the QDs. In some instances, the emissive layer 50 can include QD-TADF conjugates without the use of a host material.

Figure 2:
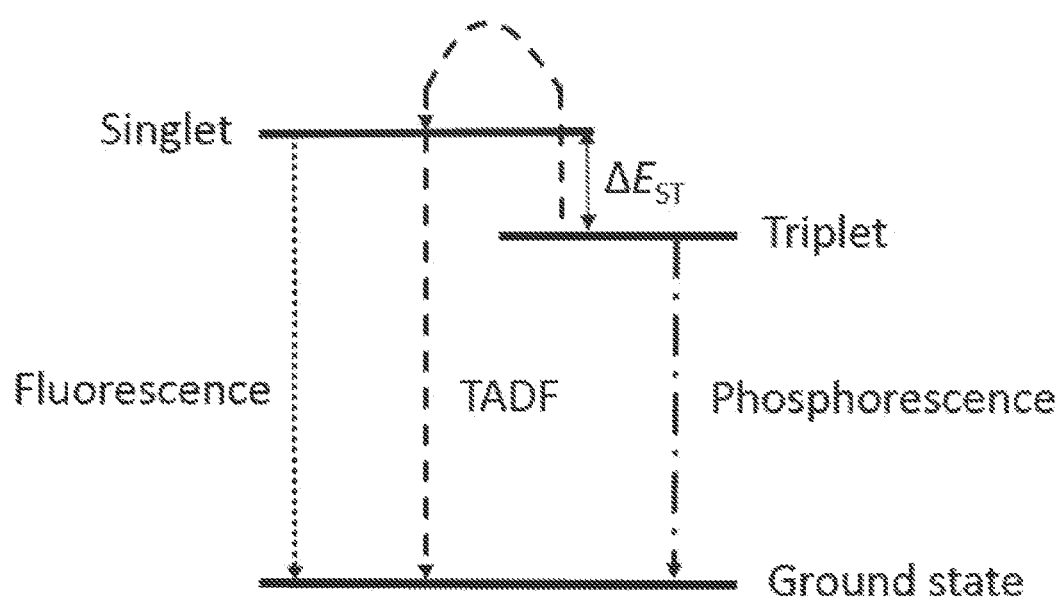
FIG. 2 depicts an energy level diagram of a TADF molecule.

FIG. 2 depicts an energy level diagram of a TADF molecule. In a TADF molecule, upon excitation, triplet state excitons are generated as previously discussed. Generally, triplet excitons generated from emitters such as platinum and iridium complexes non-radiatively decay from the triplet state to the ground state and do not contribute to light emission. In TADF molecules, on the other hand, the triplet excitons are upconverted to singlet state excitons via reverse intersystem crossing (RISC) due to the small energy gap ($\Delta E_{st}$) between the singlet and triplet states, and light emission can be extracted as delayed fluorescence from the singlet state. In TADF molecules, $\Delta E_{st}$ is provided by the absorption of thermal energy.

In accordance with various aspects of the present disclosure, a QD-TADF conjugate comprising a quantum dot fluorescent emitter dopant and a TADF-assistant dopant is provided for use in electroluminescent display devices such as QD-LED devices. QDs may provide advantages over organic fluorophores as fluorescent emitters for TADF-assisted light-emitting devices. Embodiments of the present disclosure are designed to combine the exciton harvesting capabilities of TADF molecules to achieve near unity internal quantum efficiency, with energy transfer of harvested excitons to QDs with high photoluminescence quantum yield, to achieve hyperfluorescent, narrow emission quantum dot devices. The narrow, pseudo-Gaussian emission of QDs may lead to better colour purity and efficiency as compared to organic fluorophores. QD fluorescence emission is tuneable by tuning the particle size and composition, whereas organic fluorophores generally exhibit broad and specific emission profiles. Additionally, the fluorescence quantum yields (QYs) of QDs are typically higher than those of organic fluorophores.

In some instances, an emitting layer of a QD-LED device can include a population QD-TADF conjugates dispersed in a host matrix. In some instances, an emitting layer of a QD-LED device can include a population of QD-TADF conjugates and be free of a host matrix. In either instance, emitting layers having QD-TADF conjugates can have a thickness ranging from about 5 nm to about 100 nm, alternatively about 7.5 nm to about 80 nm, alternatively about 10 nm to about 60 nm, alternatively about 12.5 nm to about 40 nm, alternatively about 15 nm to about 20 nm, alternatively about 17.5 nm to about 25 nm, and alternatively about 20 nm. Additionally, the concentration (in wt % of the layer) of the QD-TADF conjugates within the emissive layer can range from about 1 wt % to about 50 wt %, alternatively about from about 5 wt % to about 40 wt %, from about 10 wt % to about 30 wt %, alternatively from about 15 wt % to about 25 wt %, and alternatively about 20 wt %.

Figure 3:
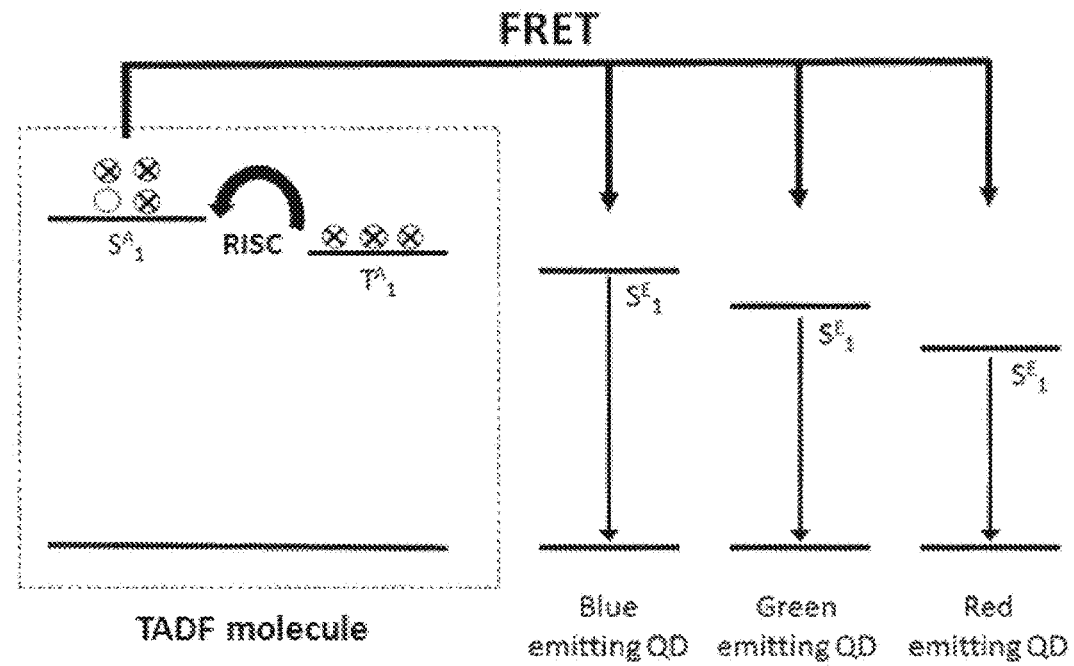
FIG. 3 depicts an energy level diagram of a QD conjugated with a TADF molecule in accordance with various aspects of the present disclosure.

FIG. 3 depicts an energy level diagram of a QD-TADF conjugate to various aspects of the present disclosure. When an emissive layer includes only TADF compounds the triplet excitons are upconverted to singlet state excitons via reverse intersystem crossing (RISC) due to the small energy gap ($\Delta E_{st}$) between the singlet and triplet states, and light emission can be extracted as delayed fluorescence from the singlet state as described above. When TADF molecules are conjugated with QDs, however, the singlet excitons of the TADF molecules are resonantly transferred to a singlet state of the QDs via Förster resonance energy transfer (FRET). Light is then emitted as delayed fluorescence from the singlet state of the QDs.

In some instances, the QDs of the QD-TADF conjugates can be blue-emitting QDs. In other instances, the QDs of the QD-TADF conjugates can be green-emitting QDs. In yet other instances, the QDs of the QD-TADF conjugates can be red-emitting QDs. In yet other instances, the QDs of the QD-TADF conjugates can be any combination of blue-, green- and red-emitting QDs. In yet other instances, the QDs of the QD-TADF conjugates can be UV-emitting QDs. In yet other instances, the QDs of the QD-TADF conjugates can be IR-emitting QDs. In yet other instances, the QDs of the QD-TADF conjugates can be tuned to emit at any wavelength ranging from the UV to the IR regions of the electromagnetic spectrum, depending on the application. The particular TADF molecule is not limiting. TADF molecules used in accordance with various aspects of the present disclosure can include, for example, those described in U.S. Pat. Nos. 9,502,668, 9,634,262, 9,660,198, 9,685,615, U.S. Patent Application Publication No. 2016/0372682, U.S. Patent Application Publication No. 2016/0380205, and U.S. Patent Application Publication No. 2017/0229658, the entire contents of which are incorporated by reference herein.

In accordance with various embodiments of the present disclosure, TADF molecules utilized comprise at least two major components: 1) at least one electron donor group (D group); and 2) an electron acceptor group (A group) bound to the at least one D group; wherein the electron donor group (D group) and/or the electron acceptor group (A group) can be bound to the QD or the QD capping ligand via, for example, a covalent bond, an ionic bond and/or an intermolecular force. For instance, the electron donor group (D group) can include a hydroxyl or a carboxylic acid, and the electron donor group (D group) can be bound to the QD or the QD capping ligand via covalent bonds, ionic bonds and/or intermolecular force. In some instances, the electron acceptor group (A group) can include a nitrile, and the electron acceptor group (A group) can be bound to the QD or the QD capping ligand via covalent bonds, ionic bonds and/or intermolecular force, but the disclosure is not limited thereto. In some instances, when neither the electron donor group (D group) or electron acceptor group (A group) can be bound to the QD or the QD capping ligand, the TADF molecules further comprise 3) a quantum dot (QD) binding group.

In general, the coordination about the final inorganic surface atoms in any core, core-shell or core-multi shell nanoparticle (i.e., QD) is incomplete, with highly reactive "dangling bonds" on the surface, which can lead to particle agglomeration. To overcome this problem, "bare" surface atoms are passivated (capped) with protecting organic groups, referred to herein as capping ligands or a capping agent. The capping ligand is usually a Lewis base bound to surface metal atoms of the outer most inorganic layer of the particle. These capping ligands are usually hydrophobic (for example, alkyl thiols, fatty acids, alkyl phosphines, alkyl phosphine oxides, and the like).

In some instances, QDs having "bare" surfaces can be capped with TADF molecules where the QD binding groups of the TADF molecules are directly bound to the QD surface. In other instances, QDs having capping ligands bound to their surfaces are reacted with TADF molecules and the capping ligands are replaced with the TADF molecules via ligand exchange. In some instances, direct binding of the TADF molecules to the QDs can be formed by the amino-containing TADF molecules to the QDs via the formation of an amide bond when the capping ligand includes, for example, a hydroxyl group or a carboxylic group. In some instances, direct binding of the TADF molecules to the QDs is generally accomplished via intermolecular forces such as hydrogen bonding, π-π stacking, dipole-dipole interactions or van der Waals forces.

In some instances, QDs can have capping ligands bound to their surfaces and the capping ligands can have a functional group which reacts with a QD binding group of a TADF molecule to form a bond therebetween via intermolecular forces, resulting in an indirect binding of the TADF molecule to the QD via the capping ligand. Exemplary intermolecular forces which can be used for indirect binding include, but are not limited to hydrogen bonding, pi-pi stacking, dipole-dipole interactions or van der Waals forces.

In some instances, QDs can have capping ligands bound to their surfaces and the capping ligands can have a functional group which reacts with a QD binding group of a TADF molecule to form a covalent bond therebetween, resulting in an indirect binding of the TADF molecule to the QD via the capping ligand. For example, a TADF molecule having a QD binding group which includes a thiol can be reacted with a capping ligand having a thiol to form a disulphide bond therebetween. Also for example, a TADF molecule having a QD binding group which includes a primary amine can be reacted with a capping ligand having a carboxylic acid to form an amide bond therebetween after the carboxylic acid is acylated. Also for example, a TADF molecule having a QD binding group which includes a primary amine can be reacted with a capping ligand having a hydroxyl to form an amide bond therebetween via a catalyst mediated dehydrogenative acylation reaction. Also for example, a TADF molecule having a QD binding group which includes either of a ketone or an aldehyde can be reacted with a capping ligand having an amino to form an imine bond therebetween. Also for example, a TADF molecule having a QD binding group which includes a hydroxyl can be reacted with a capping ligand having a hydroxyl to form an ether bond therebetween. The reactions described above, for binding the capping ligand of a QD to a QD binding group of a TADF molecule, are not limiting. One of ordinary skill in the art can appreciate other reactions that may result in binding or coupling the capping ligand of a QD to a QD binding group of a TADF molecule.

In some instances, the TADF itself can be bound to a QD or the capping ligand of a QD when, for example, the D group and/or the A group of the TADF contains any one of the following functional groups: a primary amine, a secondary amine, a tertiary amine, a nitrile, a nitroso, a nitro, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

In some instances, the QD binding group is bound to the at least one D group and has the following general formula (I):

A-D-R¹ (I)

where $R^1$ is any one of a primary amine, a secondary amine, a tertiary amine, a nitrile, a nitroso, a nitro, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

In some instances, the QD binding group is bound to the at least one D group and has the following general formula (II):

A-D-R²—R³ (II)

where $R^2$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^3$ is any one of a primary amine, a secondary amine, a tertiary amine, a nitroso, a nitro, a nitrile, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

In some instances, the QD binding group is bound to the A group and has the following general formula (III):

D-A-R⁴ (III)

where $R^4$ is any one of a primary amine, a secondary amine, a tertiary amine, a nitrile, a nitroso, a nitro, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

In some instances, the QD binding group is bound to the A group and has the following general formula (IV):

D-A-R⁵—R⁶ (IV)

where $R^5$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^6$ is any one of a primary amine, a secondary amine, a tertiary amine, a nitrile, a nitroso, a nitro, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

Figure 4:
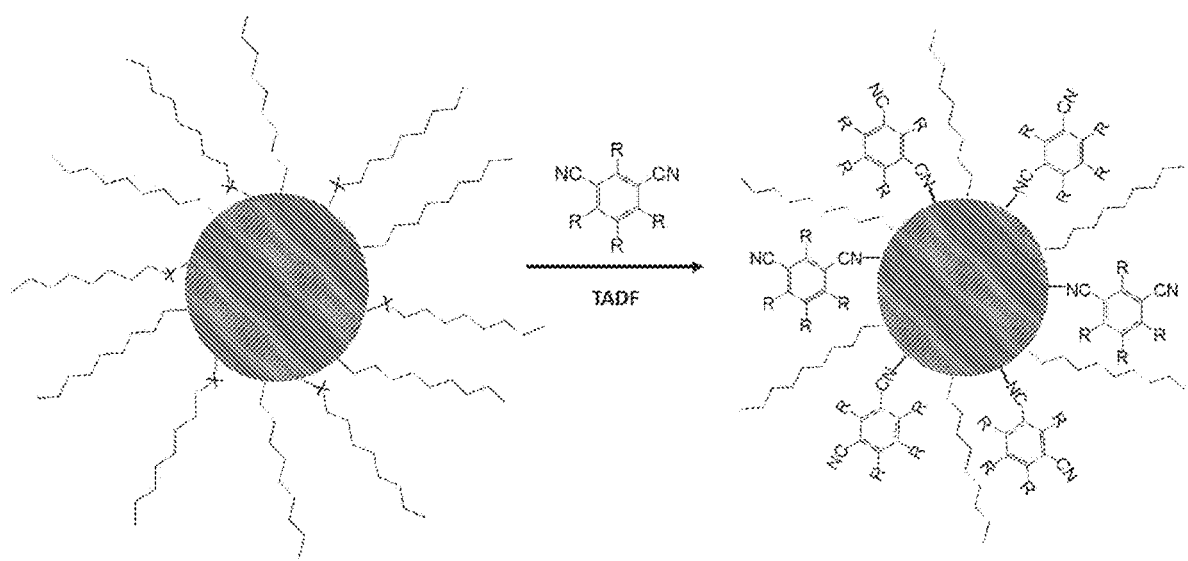
FIG. 4 is a schematic illustration of an exemplary direct conjugation of a TADF molecule with a QD via ligand exchange in accordance with various embodiments of the present disclosure.

FIG. 4 is a schematic illustration of an exemplary direct conjugation of a TADF molecule with a QD via ligand exchange in accordance with various embodiments of the present disclosure. In FIG. 4, a QD is passivated with capping ligands, some of which are bound to the surface of the QD via a Lewis base X. The passivated QD is reacted with a TADF molecule comprising a Lewis base, such as a nitrile group as shown in FIG. 4. During the reaction, the Lewis base X groups are removed from the QD surface and replaced, or exchanged, with the TADF molecules to form a QD-TADF conjugate with the TADF molecule directly bound to the QD. In the TADF molecule of FIG. 4, at least one of the R groups comprises an electron acceptor group (A Group).

Figure 5A:
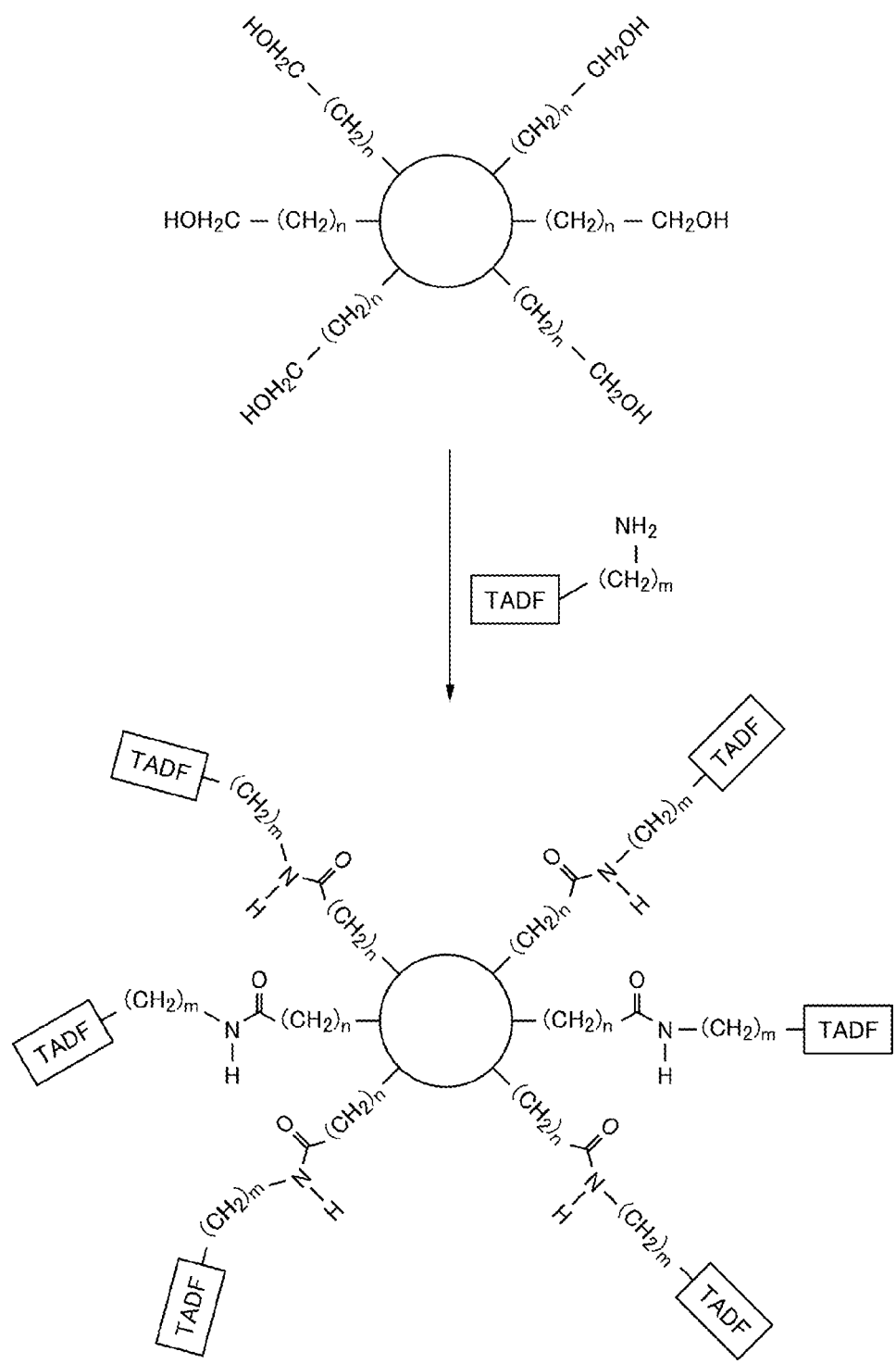
FIG. 5A is a schematic illustration of an exemplary indirect conjugation of a TADF molecule with a QD in accordance with various embodiments of the present disclosure.
Figure 5B:
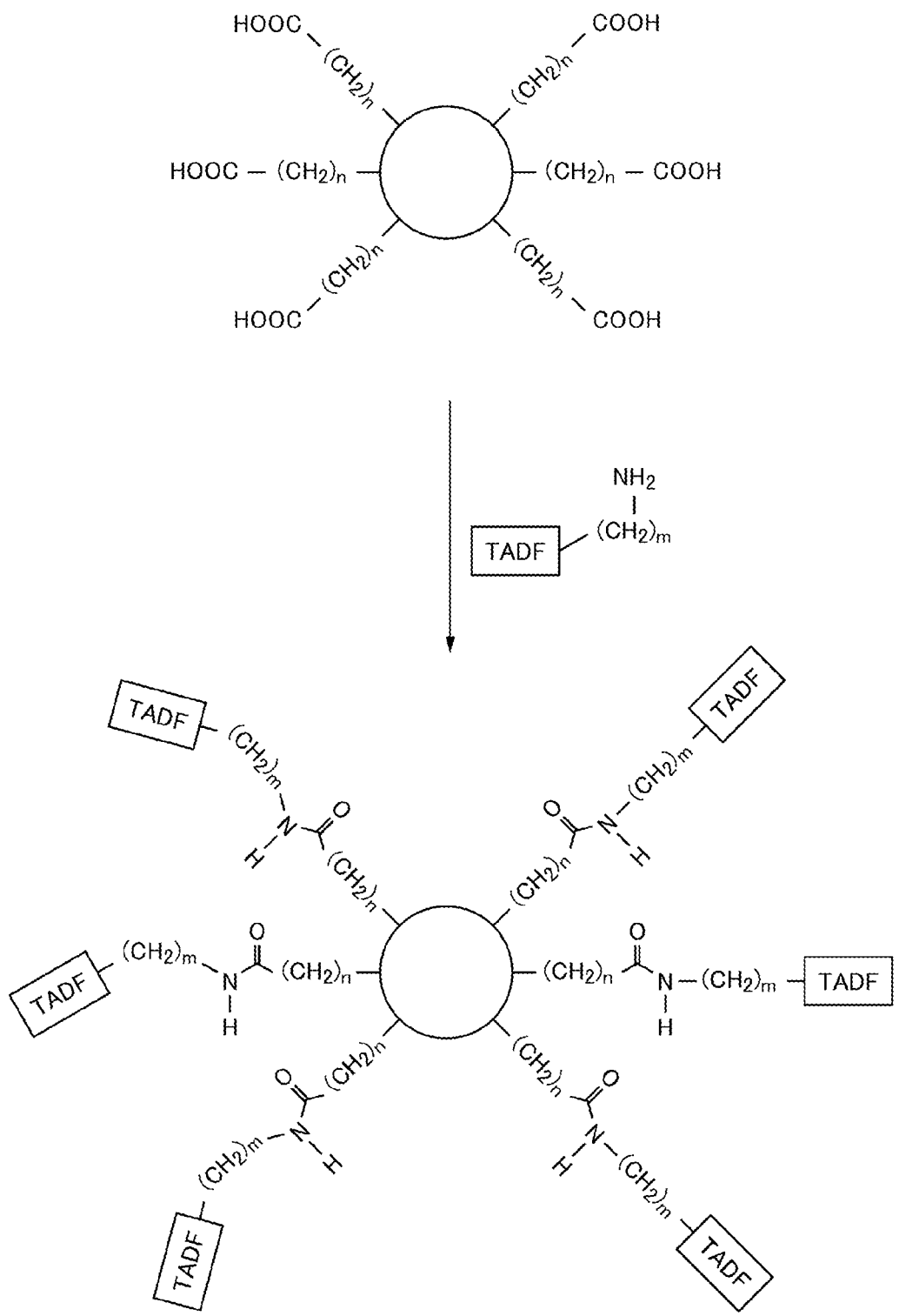
FIG. 5B is a schematic illustration of another exemplary indirect conjugation of a TADF molecule with a QD in accordance with various embodiments of the present disclosure.

FIG. 5A is a schematic illustration of an exemplary indirect conjugation of a TADF molecule with a QD in accordance with various embodiments of the present disclosure. In FIG. 5A, a QD having alkyl capping ligands with terminal hydroxyl groups is reacted with TADF molecules having a terminal primary amine via a catalyst mediated dehydrogenative acylation reaction to form a QD-TADF conjugate. FIG. 5B is a schematic illustration of another exemplary indirect conjugation of a TADF molecule with a QD in accordance with various embodiments of the present disclosure. In FIG. 5B, a QD having alkyl capping ligands with terminal carboxyl groups is reacted with TADF molecules having a terminal primary amine to form a QD-TADF conjugate. As shown in FIGS. 5A and 5B, the TADF molecules are indirectly bound to the QD by covalently linking the TADF molecules with capping ligands on the QD surface through amide bonds. In FIGS. 5A and 5B, variables n and m can, in some instances, range from 0 to 24. While FIGS. 5A and 5B show the formation of an amide bond to bind TADF molecules to QD capping ligands, other types of binding reactions can be utilized as discussed above.

In some instances, QDs can have capping ligands bound to their surfaces and the capping ligands can have a functional group which reacts with a QD binding group of a TADF molecule to form a hydrogen bond therebetween, resulting in an indirect binding of the TADF molecule to the QD via the capping ligand. In some instances, a TADF molecule having a QD binding group which includes a nitrile can be reacted with a capping ligand having a hydroxyl to form a hydrogen bond therebetween. In some instances, a TADF molecule having a QD binding group which includes an aromatic ketone, an ether, a nitrile group, a hydroxyl group, an amino group, a carboxyl group, a fluoroalkyl group, a fluoroaryl group, a sulfone, or a sulfoxide, can be reacted with a capping ligand having, for example, a hydroxyl, primary amine or secondary amine to form a hydrogen bond therebetween.

Figure 6:
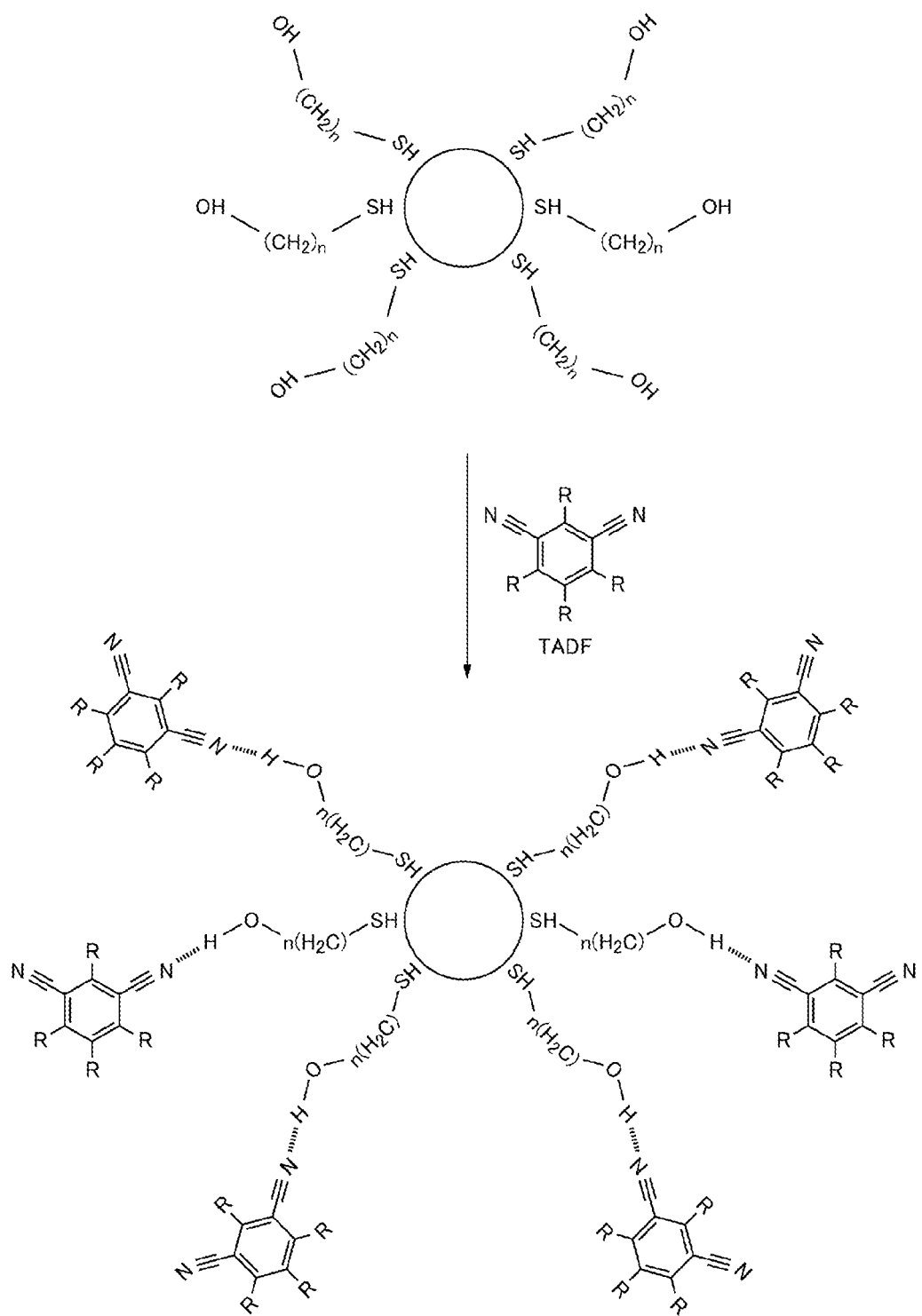
FIG. 6 is a schematic illustration of another exemplary indirect conjugation of a TADF molecule with a QD in accordance with various embodiments of the present disclosure.

FIG. 6 is a schematic illustration of another exemplary indirect conjugation of a TADF molecule with a QD, via hydrogen bonding, in accordance with various embodiments of the present disclosure. In FIG. 6, a TADF molecule is indirectly conjugated with a QD via hydrogen bonding between the nitrogen of a terminal nitrile group on the TADF molecule and a hydrogen of a terminal hydroxyl group of a capping ligand coordinated on the surface of the QD. In FIG. 6, variable n can range from 1 to 24 alternative. In some instances, the repeating unit can be —CH₂CH₂O— rather than —CH₂—. In some instances, the capping ligand can include an aromatic or cyclic hydrocarbon (saturated or unsaturated). In some instances, the capping ligand can be coordinated with the QD via a functional group other than a thiol such as, for example, an amine, a carboxylate, and alcohol, a phosphine, a phosphine oxide, or a selenol.

Figure 7:
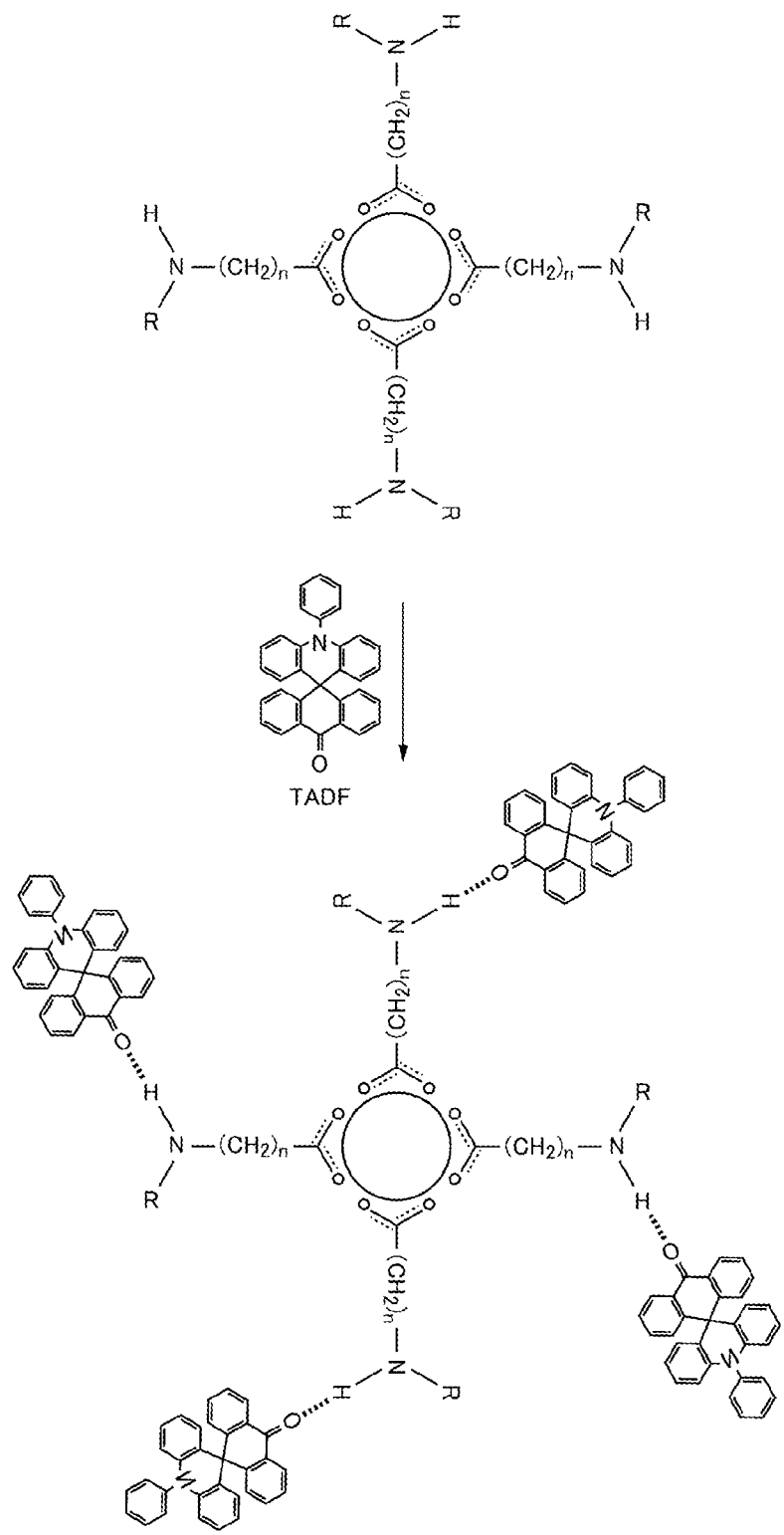
FIG. 7 is a schematic illustration of yet another exemplary indirect conjugation of a TADF molecule with a QD in accordance with various embodiments of the present disclosure.

FIG. 7 is a schematic illustration of yet another exemplary indirect conjugation of a TADF molecule with a QD, via hydrogen bonding, in accordance with various embodiments of the present disclosure. In FIG. 7, a TADF molecule is indirectly conjugated with a QD via hydrogen bonding between the oxygen of an aromatic (i.e., conjugated) ketone on the TADF molecule and a hydrogen of a terminal primary amine (R is H) or secondary amine (R is, for example, an alkyl group) of a capping ligand coordinated on the surface of the QD. In FIG. 7, variable n can range from 1 to 24 alternative. In some instances, the repeating unit can be —CH$_2$CH$_2$O— rather than —CH$_2$—. In some instances, the capping ligand can include an aromatic or cyclic hydrocarbon (saturated or unsaturated). In some instances, the capping ligand can be coordinated with the QD via a functional group other than a carboxylate such as, for example, an amine, and alcohol, a phosphine, a phosphine oxide, a thiol, or a selenol.

In some instances, a TADF molecule may comprise more than one QD binding group capable of binding to the QD surface. A solution of QDs having capping ligands bound to their surfaces may be deposited to form a QD layer. The QD layer may be subsequently treated with a solution of the TADF molecules comprising more than one QD binding group, under conditions facilitating the binding of a TADF molecule to more than one QD, displacing existing ligands bound to the QD surface, to enable a TADF molecule to act as a bridging ligand between two QDs.

Figure 8:
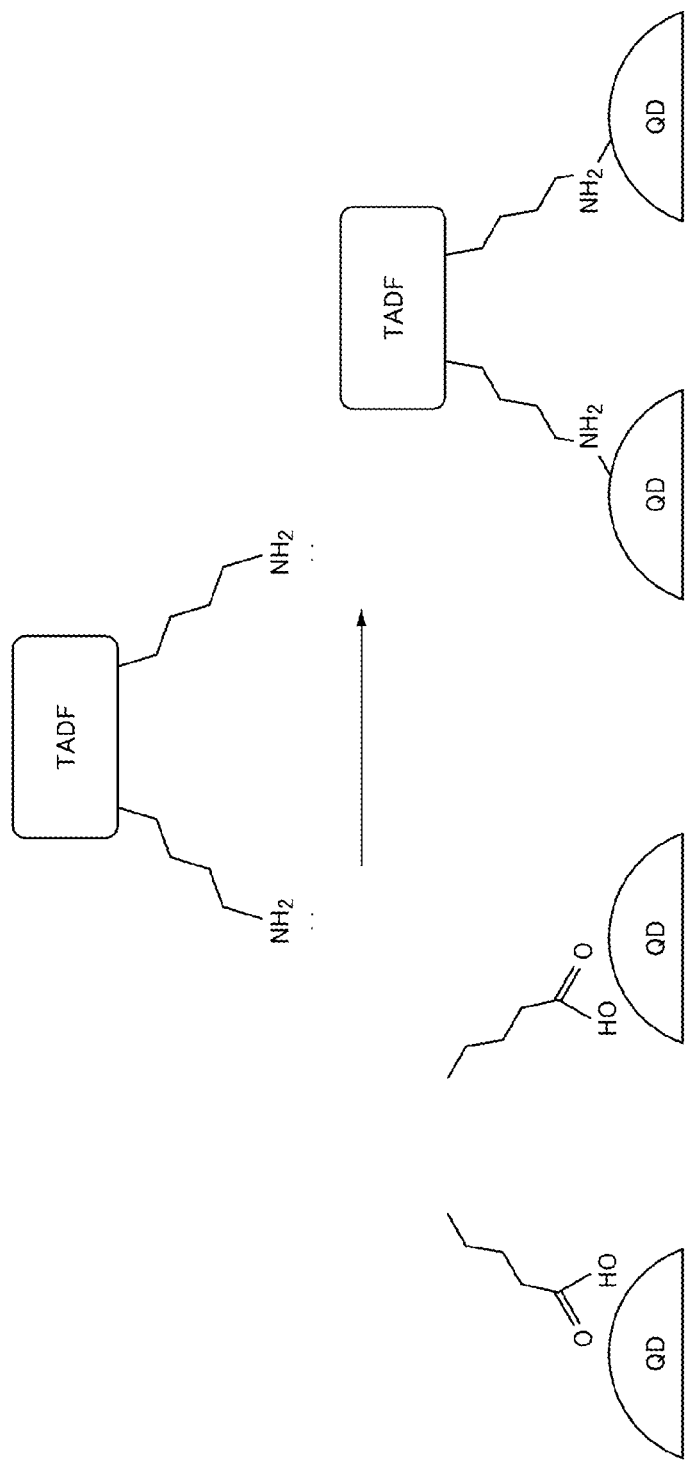
FIG. 8 is a schematic illustration of an exemplary conjugation of a TADF molecule with two QDs to form a bridge, in accordance with various embodiments of the present disclosure.

FIG. 8 is a schematic illustration of an exemplary conjugation of a TADF molecule with two QDs to form a bridge, in accordance with various embodiments of the present disclosure. In FIG. 8, QDs having carboxylate ligands are reacted with TADF molecules having two terminal primary amines, the TADF molecules displacing the QD ligands to form a QD-TADF-QD bridge where a TADF molecule bridges two QDs. While FIG. 8 illustrates the use of QDs having carboxylate capping ligands and TADF molecules with primary amines, one or each may have functional groups other than carboxylates or primary amines for ligand exchange such as, for example, a secondary amine, a tertiary amine, a nitrile, a nitroso, a nitro, a thiol, a selenol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, such as a trifluoromethyl, a fluoroaryl, a sulfone, or a sulfoxide.

In some instances, a TADF molecule may comprise more than one QD binding group. A solution of QDs having capping ligands bound to their surfaces, the capping ligands having a functional group which reacts to a QD binding group of a TADF molecule, may be deposited to form a QD layer. The QD layer may be subsequently treated with a solution of the TADF molecules comprising more than one QD binding group, under conditions facilitating the bonding of a TADF molecule to more than one QD, to enable a TADF molecule to act as a bridging ligand between two QDs.

Figure 9:
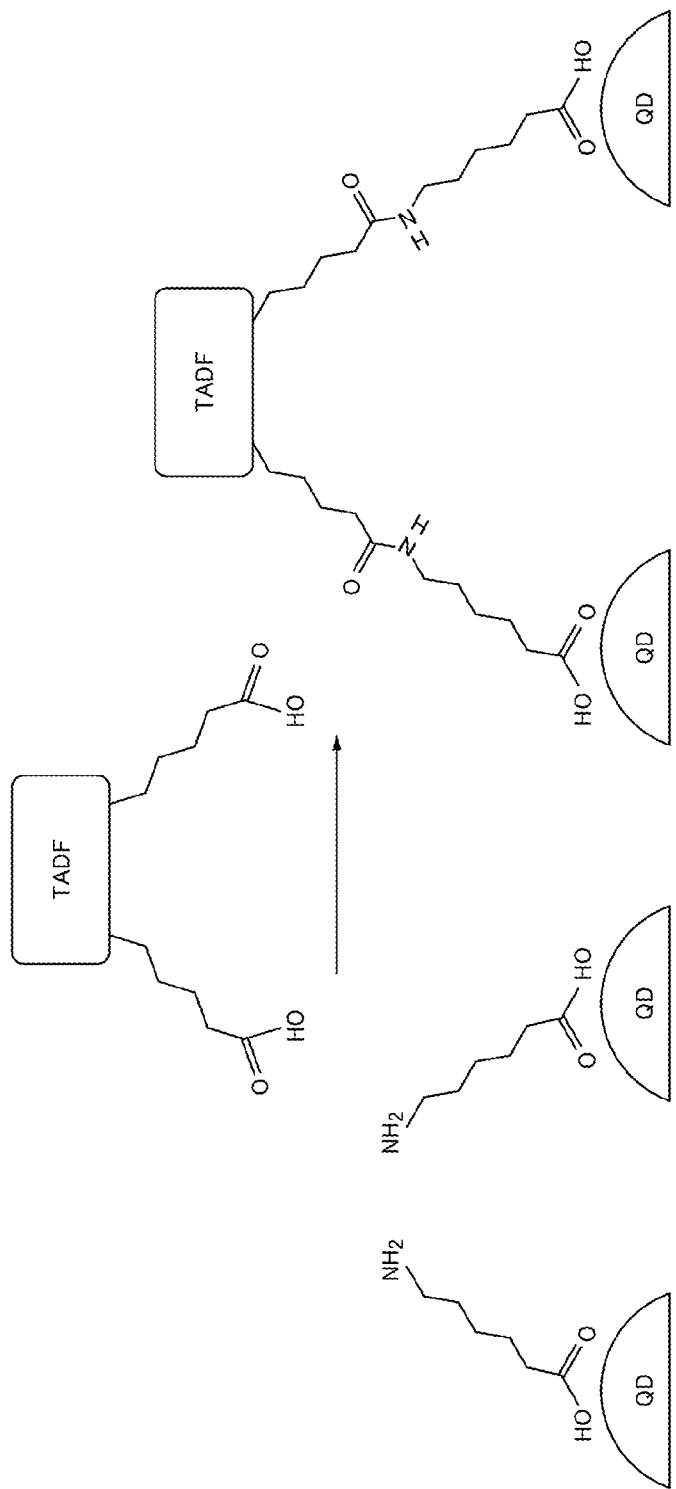
FIG. 9 is a schematic illustration of another exemplary conjugation of a TADF molecule with two QDs to form a bridge in accordance with various embodiments of the present disclosure.

FIG. 9 is a schematic illustration of an exemplary conjugation of a TADF molecule with two QDs to form a bridge, in accordance with various embodiments of the present disclosure. In FIG. 9, QDs having carboxylate ligands terminated with amine groups are reacted with TADF molecules having two terminal carboxylates, the carboxylate groups on the TADF molecules reacting with the amine groups on the QDs to form amide bonds acting as a QD-TADF-QD bridge where a TADF molecule bridges two QDs. While FIG. 9 illustrates QDs having capping ligands with terminal primary amines and TADF molecules with terminal carboxylates which bind by the formation of amide bonds, the use of QD capping ligands and TADF molecules with different functions groups for binding/linking reactions therebetween can be used.

In some instances, TADF molecules used in accordance with varying aspects of the present disclosure can be, TADF molecules containing at least one nitrile group (also commonly referred to as a cyano group), for example,

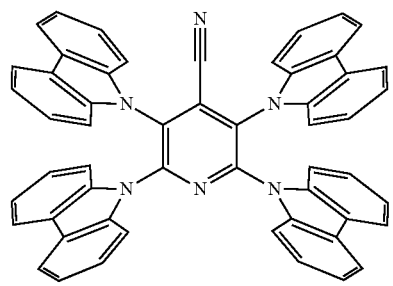 [SMILES: N#Cc1c(-n2c3ccccc3c3ccccc32)c(-n2c3ccccc3c3ccccc32)nc(-n2c3ccccc3c3ccccc32)c1-n1c2ccccc2c2ccccc21]

(2,3,5,6-tetra(9H-carbazol-9-yl)isonicotinonitrile,

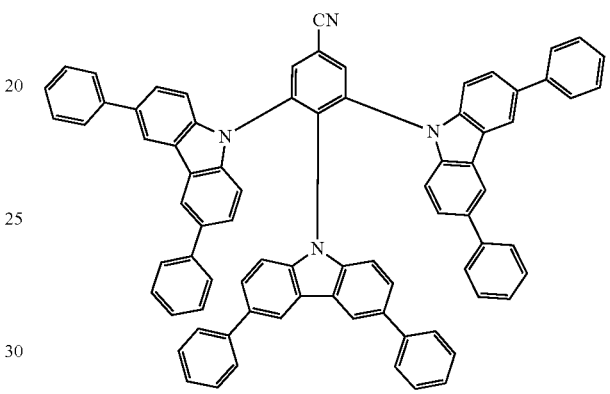

3,4,5-tris(3,6-diphenyl-9H-carbazol-9-yl)benzonitrile

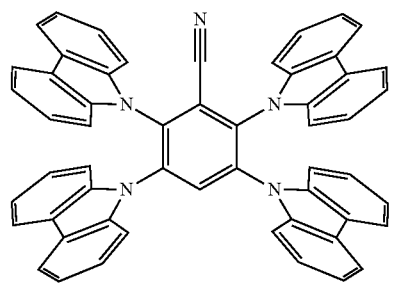 [SMILES: N#Cc1c(-n2c3ccccc3c3ccccc32)c(-n2c3ccccc3c3ccccc32)cc(-n2c3ccccc3c3ccccc32)c1-n1c2ccccc2c2ccccc21]

(2,3,5,6-tetra(9H-carbazol-9-yl)benzonitrile),

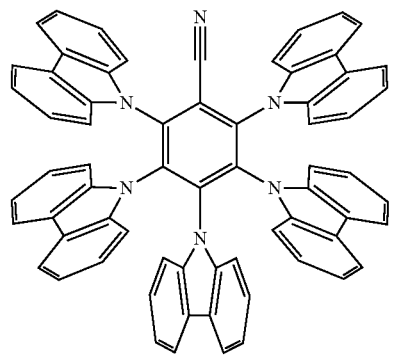 [SMILES: N#Cc1c(-n2c3ccccc3c3ccccc32)c(-n2c3ccccc3c3ccccc32)c(-n2c3ccccc3c3ccccc32)c(-n2c3ccccc3c3ccccc32)c1-n1c2ccccc2c2ccccc21]

2,3,4,5,6-penta(9H-carbazol-9-yl)benzonitrile),

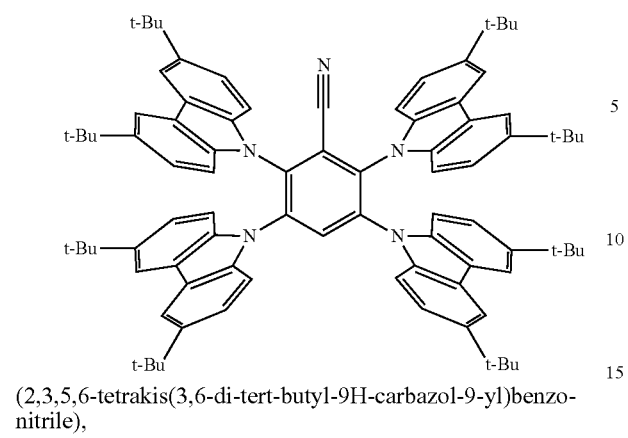
(2,3,5,6-tetrakis(3,6-di-tert-butyl-9H-carbazol-9-yl)benzonitrile),
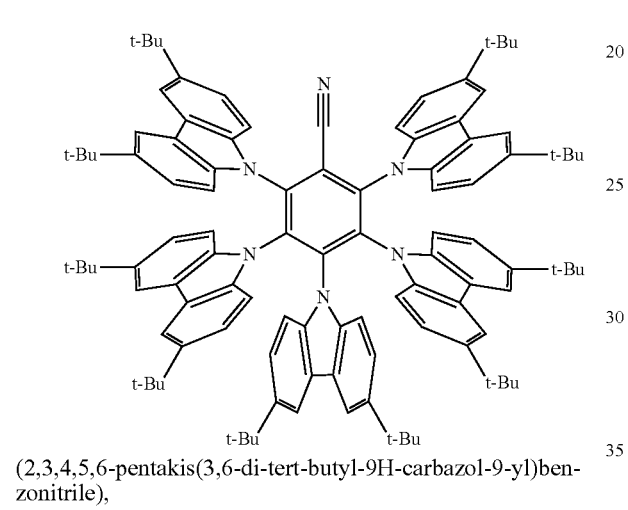
(2,3,4,5,6-pentakis(3,6-di-tert-butyl-9H-carbazol-9-yl)benzonitrile),
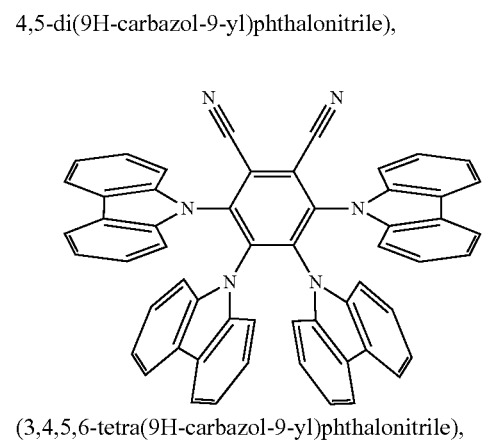
4,5-di(9H-carbazol-9-yl)phthalonitrile),
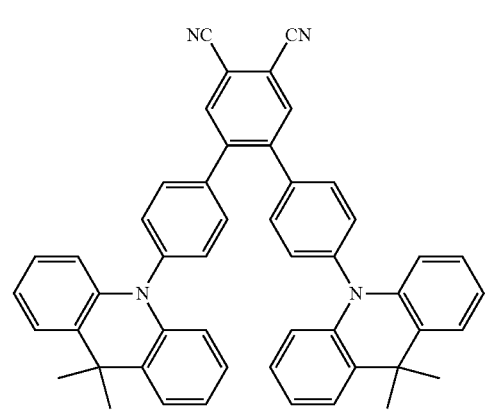 [SMILES: CC1(C)c2ccccc2N(c2ccc(-c3cc(C#N)c(C#N)cc3-c3ccc(N4c5ccccc5C(C)(C)c5ccccc54)cc3)cc2)c2ccccc21]
(4,4''-bis(9,9-dimethylacridin-10(9H)-yl)-[1,1':2',1''-terphenyl]-4',5'-dicarbonitrile),
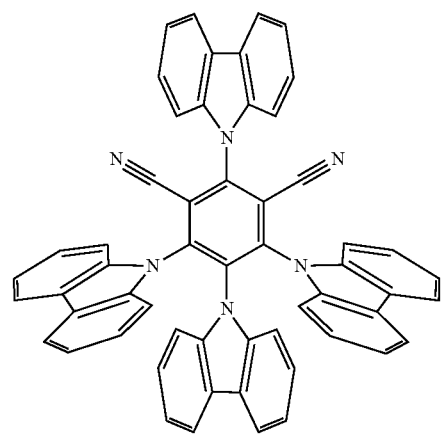 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]
(2,4,5,6-tetra(9H-carbazol-9-yl)isophthalonitrile),
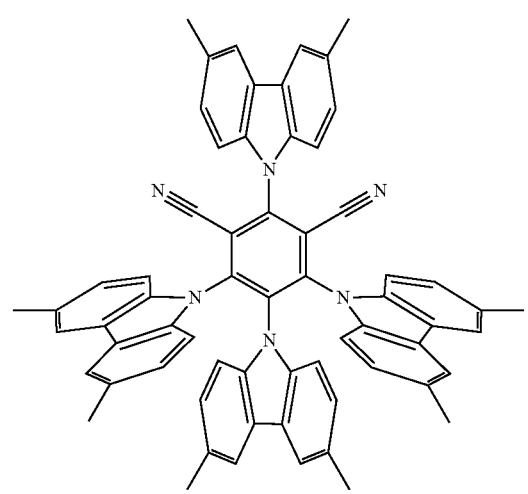
(2,4,5,6-tetrakis(3,6-dimethyl-9H-carbazol-9-yl)isophthalonitrile),
(3,4,5,6-tetra(9H-carbazol-9-yl)phthalonitrile),

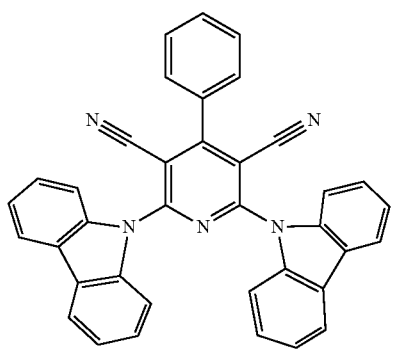 [SMILES: N#Cc1c(-n2c3ccccc3c3ccccc32)nc(-n2c3ccccc3c3ccccc32)c(C#N)c1-c1ccccc1]

(2,6-di(9H-carbazol-9-yl)-4-phenylpyridine-3,5-dicarbonitrile),

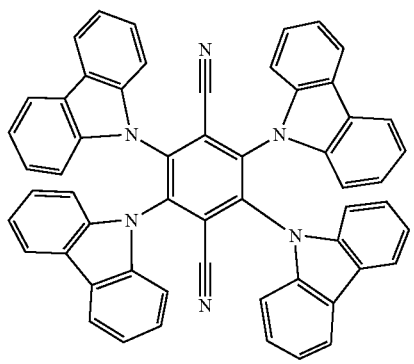 [SMILES: N#Cc1c(-n2c3ccccc3c3ccccc32)c(-n2c3ccccc3c3ccccc32)c(C#N)c(-n2c3ccccc3c3ccccc32)c1-n1c2ccccc2c2ccccc21]

(2,3,5,6-tetra(9H-carbazol-9-yl)terephthalonitrile),

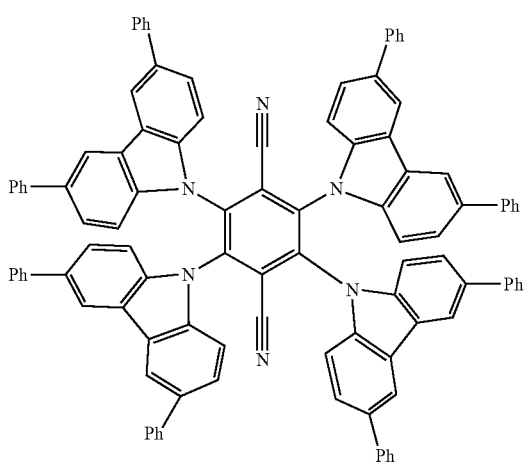 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]

(2,3,5,6-tetrakis(3,6-diphenyl-9H-carbazol-9-yl)terephthalonitrile),

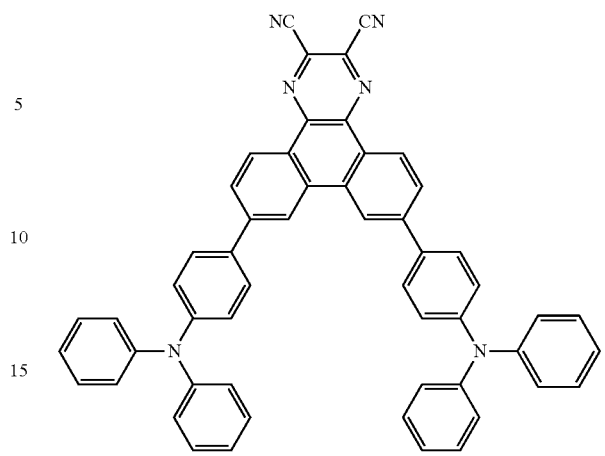

(7,10-bis(4-(diphenylamino)phenyl)dibenzo[f,h]quinoxaline-2,3-dicarbonitrile)), or any suitable structural analogs or homologs thereof.

The above described TADF molecules can be bound to the QDs through the nitrile group via, for example, a hydrogen bond or a dative bond.

In some instances, TADF molecules used in accordance with varying aspects of the present disclosure can be TADF molecules containing at least one ether group, for example,

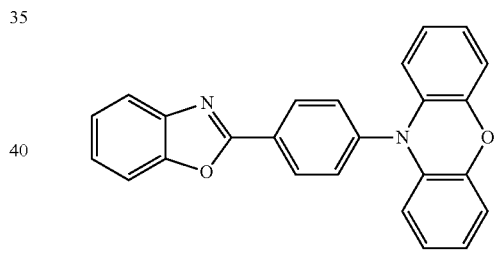

(10-(4-(benzo[d]oxazol-2-yl)phenyl)-10H-phenoxazine),

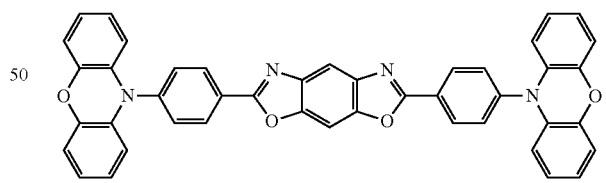

(2,6-bis(4-(10H-phenoxazin-10-yl)phenyl)benzo[1,2-d:5,4-d']bis(oxazole)), or any suitable structural analogs or homologs thereof.

The above described TADF molecules can be bound to the QDs through the ether group via, for example, hydrogen bond.

In some instances, TADF molecules used in accordance with varying aspects of the present disclosure can be, TADF molecules containing at least one ketone group, for example,

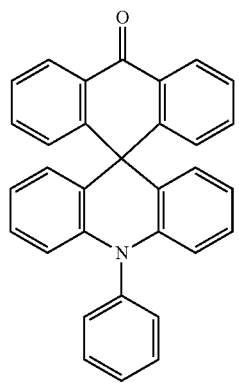 [SMILES: O=C1c2ccccc2C2(c3ccccc31)c1ccccc1N(c1ccccc1)c1ccccc12]
10-phenyl-10H,10'H-spiro[acridine-9,9'-anthracen]-10'-one,
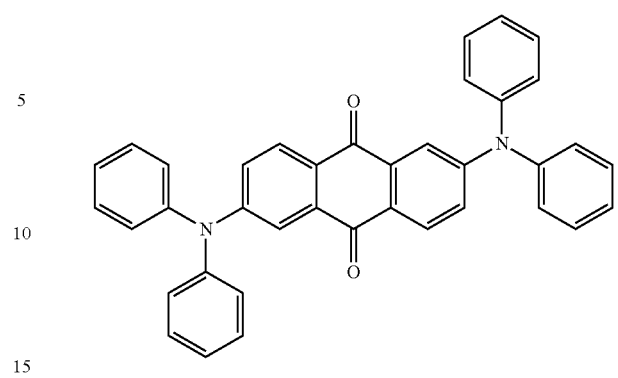
(2,6-bis(diphenylamino)anthracene-9,10-dione),
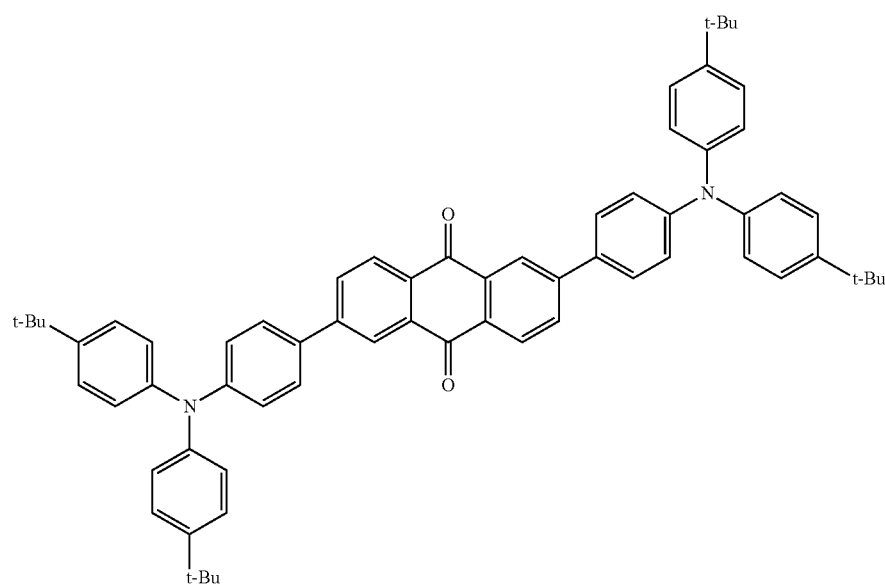 [SMILES: CC(C)(C)c1ccc(N(c2ccc(-c3ccc4c(c3)C(=O)c3ccc(-c5ccc(N(c6ccc(C(C)(C)C)cc6)c6ccc(C(C)(C)C)cc6)cc5)cc3C4=O)cc2)c2ccc(C(C)(C)C)cc2)cc1]
(2,6-bis(4-(bis(4-(tert-butyl)phenyl)amino)phenyl)anthracene-9,10-dione),
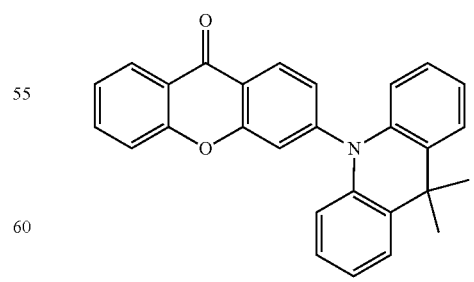
(3-(9,9-dimethylacridin-10(9H)-yl)-9H-xanthen-9-one),

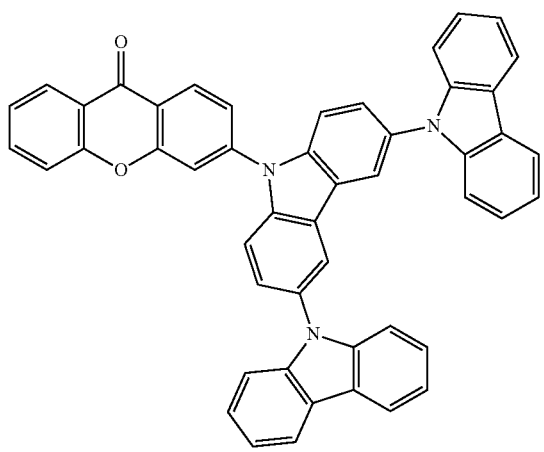 [SMILES: O=c1c2ccccc2oc2cc(-n3c4ccc(-n5c6ccccc6c6ccccc65)cc4c4cc(-n5c6ccccc6c6ccccc65)ccc43)ccc12]

(3-(9'H-[9,3':6',9''-tercarbazol]-9'-yl)-9H-xanthen-9-one),

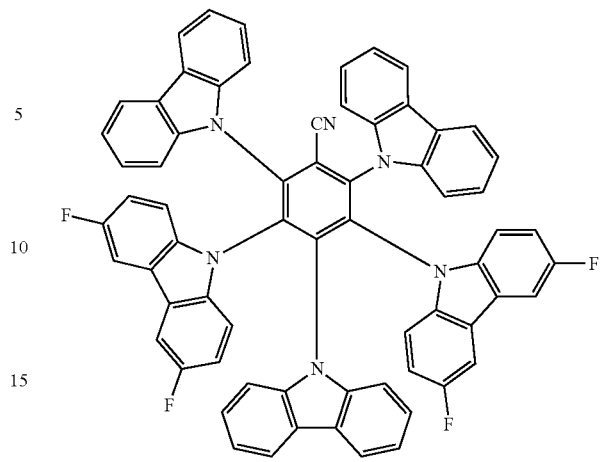

2,4,6-tri(9H-carbazol-9-yl)-3,5-bis(3,6-difluoro-9H-carbazol-9-yl)benzonitrile, or any suitable structural analogs or homologs thereof.

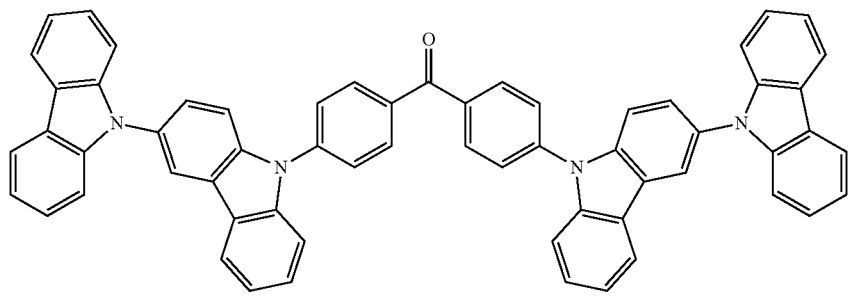 [SMILES: O=C(c1ccc(-n2c3ccccc3c3cc(-n4c5ccccc5c5ccccc54)ccc32)cc1)c1ccc(-n2c3ccccc3c3cc(-n4c5ccccc5c5ccccc54)ccc32)cc1]

(bis(4-(9H-[3,9'-bicarbazol]-9-yl)phenyl)methanone), or any suitable structural analogs or homologs thereof.

The above described TADF molecules can be bound to the QDs through the ketone group via, for example, a hydrogen bond or a dative bond.

In some instances, TADF molecules used in accordance with varying aspects of the present disclosure can be TADF molecules containing at least one fluoroalkyl group or fluoroaryl group, for example,

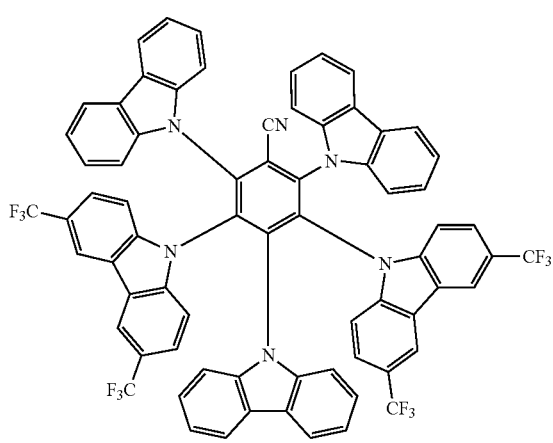 [SMILES: N#Cc1c(-n2c3ccccc3c3ccccc32)c(-n2c3ccc(C(F)(F)F)cc3c3cc(C(F)(F)F)ccc32)c(-n2c3ccccc3c3ccccc32)c(-n2c3ccc(C(F)(F)F)cc3c3cc(C(F)(F)F)ccc32)c1-n1c2ccccc2c2ccccc21]

2,4,6-tri(9H-carbazol-9-yl)-3,5-bis(3,6-bis(trifluoromethyl)-9H-carbazol-9-yl)benzonitrile, The above described TADF molecules can be bound to the QDs through the fluoroalkyl or fluoroaryl group via, for example, a hydrogen bond.

In some instances, TADF molecules used in accordance with varying aspects of the present disclosure can be TADF molecules containing at least one sulfone or sulfoxide, for example,

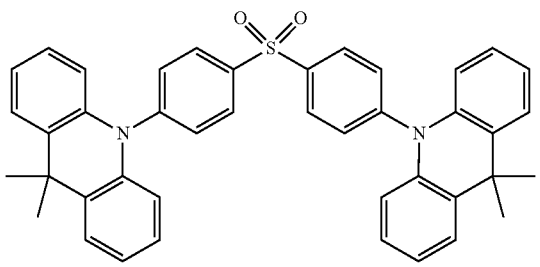

(10,10'-(sulfonylbis(4,1-phenylene))bis(9,9-dimethyl-9,10-dihydroacridine)), or any suitable structural analogs or homologs thereof.

The above described TADF molecules can be bound to the QDs through the sulfone or sulfoxide group via, for example, a hydrogen bond or a dative bond.

To optimize the performance of QD-TADF conjugates in an emissive layer of an electroluminescent device, such as an OLED device, it may be advantageous to design QDs having various qualities. First, the QDs should have high oscillator strength. Second, the QDs should be fabricated to have high FRET with the TADF molecule. Third, the QDs should be fabricated to be strong absorbers. Finally, the QDs should be fabricated to exhibit a short excited state lifetime. One of ordinary skill in the art will appreciate that the above are not necessarily the only qualities that may be optimized in systems according to the present disclosure.

Maximization of FRET

In accordance with various aspects of the present disclosure, singlet excitons of the TADF molecule are resonantly transferred to a singlet state of the QDs via FRET. A critical distance for the near-field dipole-dipole coupling mechanism, FRET, can be calculated from the spectral overlap of a TADF molecule (a "fluorescence donor") and a QD (an "absorbance acceptor") according to the well-known Forster mechanism [Förster, Th., Ann. Phys. 437, 55 (1948)]. To maximize the efficiency of FRET between the TADF molecule and the QD, the critical distance should be determined. The critical distance, $r_0$, between the TADF molecule and the QD is the distance at which the FRET efficiency is 50%, and is defined Equation 1:

$$r_0^2 = \frac{9}{8\pi} \frac{c^4}{n^4} \kappa^2 \eta_D \int \frac{S_D(\omega)\sigma_A(\omega)}{\omega^4} d\omega$$

where c is the speed of light in a vacuum, n is the refractive index of the material, $\kappa^2$ is an orientation factor, $\eta_D$ is the photoluminescence (PL) quantum efficiency of the TADF molecule, SD is the normalised PL spectrum of the TADF molecule, and $\sigma_A$ is the QD absorption cross-section. [Y. Q. Zhang and X. A. Cao, Appl. Phys. Lett., 2010, 97, 253115]. The critical distance, $r_0$, can thus be manipulated by, for example, altering the PL properties of the TADF molecule (photoluminescence maximum ($PL_{max}$), full-width at half-maximum (FWHM) and PL quantum efficiency, and $\sigma_A$, which may be influenced by factors such as the shape, composition and architecture of the QDs. The better the spectral overlap between the TADF emission and the QD absorption, the better the transfer efficiency and thus the longer the distance over which the energy can be carried.

Figure 10:
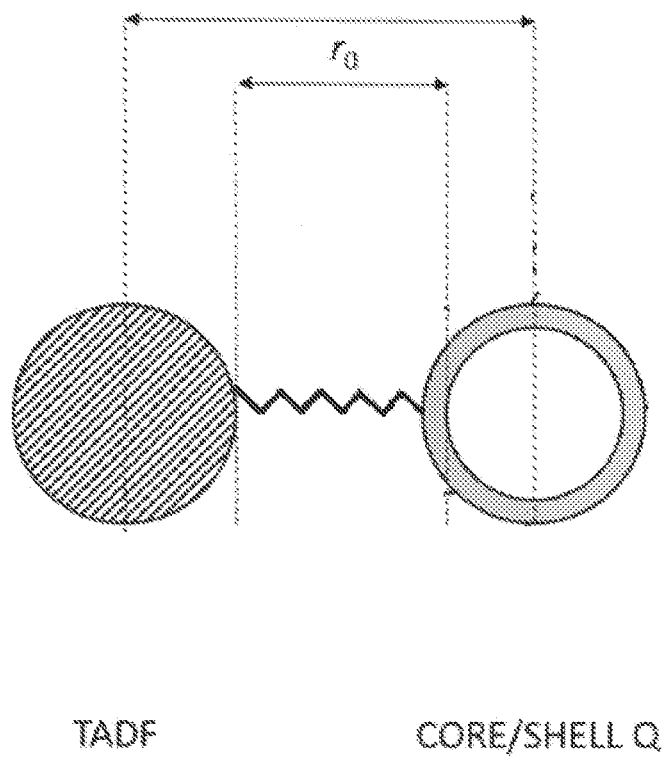
FIG. 10 is a schematic illustration of alternative bases for critical distance ($r_o$) determination in accordance with various aspects of the present disclosure.

FIG. 10 is a schematic illustration of alternative bases for $r_o$ determination. In some instances, $r_0$ can be measured from the centre of the TADF molecule to the centre of the QD core (from which emission takes place in a Type I QD). In other instances, $r_0$ can be measured from the edge of the TADF molecule to the edge of the QD core.

While the TADF molecule is shown in FIG. 10 as a circle or sphere, one of ordinary skill in the art can readily appreciate that the shape of any particular TADF molecule is dependent upon its chemical structure. Additionally, while the QD is shown as being spherical, one of ordinary skill in the art can readily appreciate that the shape of the QDs used in accordance with various aspects of the present disclosure can vary as described herein. QDs used in accordance with various aspects of the present disclosure can be any one of core, core-shell, core-multishell or quantum dot-quantum well (QD-QW) QDs. If $r_0$ is measured from the edge of the TADF molecule to the edge of the QD core, a QD-QW architecture may be desirable. A QD-QW comprises a narrower band gap first shell sandwiched between a core and a second shell of a wider band gap material, with emission coming from the first shell. Therefore, the distance between the edge of the TADF molecule and edge of the core in a core/shell QD may be greater than that between the edge of the TADF molecule and the edge of the first shell in a QD-QW.

QDs used in accordance with varying aspects of the present disclosure can have a size ranging from 2-100 nm and include core material comprising:

IIA-VIB (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe, BaS, BaSe, BaTe;

IIB-VIB (12-16) material consisting of a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe;

II-V material consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material consisting of a first element from group 13 of the periodic table and a second element from group 15 of the periodic table and also including ternary and quaternary materials and doped materials. Nanoparticle material includes but is not restricted to: BP, AlP, AlAs, AlSb; GaN, GaP, GaAs, GaSb; InN, InP, InAs, InSb, AlN, BN;

III-IV material consisting of a first element from group 13 of the periodic table and a second element from group 14 of the periodic table and also including ternary and quaternary materials and doped materials. Nanoparticle material includes but is not restricted to: $B_4C$, $Al_4C_3$, $Ga_4C$;

III-VI material consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, GeTe; $In_2S_3$, $In_2Se_3$, $Ga_2Te_3$, $In_2Te_3$, InTe;

IV-VI material consisting of a first element from group 14 of the periodic table and a second element from group 16 of the periodic table, and also including ternary and quaternary materials and doped materials. Nanoparticle material includes but is not restricted to: PbS, PbSe, PbTe, SnS, SnSe, SnTe;

V-VI material consisting of a first element from group 15 of the periodic table and a second element from group 16 of the periodic table, and also including ternary and quaternary materials and doped materials. Nanoparticle material includes but is not restricted to: $Bi_2Te_3$, $Bi_2Se_3$, $Sb_2Se_3$, $Sb_2Te_3$; and Nanoparticle material consisting of a first element from any group in the transition metal of the periodic table, and a second element from group 16 of the periodic table and also including ternary and quaternary materials and doped materials. Nanoparticle material includes but is not restricted to: NiS, CrS, $CuInS_2$, $AgInS_2$.

By the term doped nanoparticle for the purposes of specifications and claims, refer to nanoparticles of the above and a dopant comprised of one or more main group or rare earth elements, this most often is a transition metal or rare earth element, such as but not limited to zinc sulfide with manganese, such as ZnS nanoparticles doped with $Mn^+$.

The term "ternary material," for the purposes of specifications and claims, refers to QDs of the above but a three-component material. The three components are usually compositions of elements from the as mentioned groups Example being $(Zn_xCd_{x-1}S)_mL_n$ nanocrystal (where L is a capping agent).

The term "quaternary material," for the purposes of specifications and claims, refer to nanoparticles of the above but a four-component material. The four components are usually compositions of elements from the as mentioned groups Example being $(Zn_xCd_{x-1}S_ySe_{y-1})_mL_n$ nanocrystal (where L is a capping agent).

The material used on any shell or subsequent numbers of shells grown onto the core particle in most cases will be of a similar lattice type material to the core material i.e. have close lattice match to the core material so that it can be epitaxially grown on to the core, but is not necessarily restricted to materials of this compatibility. The material used on any shell or subsequent numbers of shells grown on to the core present in most cases will have a wider bandgap then the core material but is not necessarily restricted to materials of this compatibility. The materials of any shell or subsequent numbers of shells grown on to the core can include material comprising:

IIA-VIB (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe;

IIB-VIB (12-16) material consisting of a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe;

II-V material consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material consisting of a first element from group 13 of the periodic table and a second element from group 15 of the periodic table and also including ternary and quaternary materials and doped materials. Nanoparticle material includes but is not restricted to: BP, AlP, AlAs, AlSb; GaN, GaP, GaAs, GaSb; InN, InP, InAs, InSb, AlN, BN;

III-IV material consisting of a first element from group 13 of the periodic table and a second element from group 14 of the periodic table and also including ternary and quaternary materials and doped materials. Nanoparticle material includes but is not restricted to: $B_4C$, $Al_4C_3$, $Ga_4C$;

III-VI material consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$;

IV-VI material consisting of a first element from group 14 of the periodic table and a second element from group 16 of the periodic table and also including ternary and quaternary materials and doped materials. Nanoparticle material includes but is not restricted to: PbS, PbSe, PbTe, SnS, SnSe, SnTe;

V-VI material consisting of a first element from group 15 of the periodic table and a second element from group 16 of the periodic table, and also including ternary and quaternary materials and doped materials. Nanoparticle material includes but is not restricted to: $Bi_2Te_3$, $Bi_2Se_3$, $Sb_2Se_3$, $Sb_2Te_3$; and Nanoparticle material consisting of a first element from any group in the transition metal of the periodic table, and a second element from group 16 of the periodic table and also including ternary and quaternary materials and doped materials. Nanoparticle material includes but is not restricted to: NiS, CrS, $CuInS_2$, $AgInS_2$.

As illustrated in FIG. 10, the degree of separation or distance between the TADF molecule and a QD can be controlled by varying the length of the organic moiety binding the TADF molecule to the surface of the QD. In general, the longer the organic moiety coupling or binding the TADF molecule to the QD surface, the greater the distance between the TADF molecule and the QD.

When TADF molecules are directly bound to QDs having "bare" surfaces, the distance between the TADF molecule and the QD can be varied by changing the number of alkyl, cycloalkyl or aryl carbons described above with regard to general formulae II and IV. When TADF molecules are directly bound to QD surfaces via the ligand exchange of capping ligands, the distance between the TADF molecule and the QD can also be varied by changing the number of alkyl, cycloalkyl or aryl carbons described above with regard to general formulae II and IV. When TADF molecules are indirectly bound to surfaces of QDs by the coupling or binding the QD capping ligands with QD binding ligands of the TADF molecules, the number of alkyl, cycloalkyl or aryl carbons in either one of, or both of the QD capping ligands and QD binding ligands can be altered.

To maximise FRET, smaller QDs emitting at a given wavelength may be desirable. For example, QDs based on InP, which has a narrower bulk band gap and larger Bohr radius than core QDs such as CdSe, may be advantageous. An InP QD core emitting at, for example, 620 nm, will typically have a smaller diameter than a CdSe QD core emitting at the same wavelength.

For example, the overlap along with the values used to estimate the critical distance for a system having a QD, exhibiting a maximum photoluminescence ($PL_{max}$) of 528 nm and a full-width at half-maximum (FWHM) of 39 nm, and a TADF molecule, exhibiting a $PL_{max}$ of 548 nm and a FWHM of 92 nm, are presented in Table 1. Maximizing the spectral overlap integrand of the QD and TADF molecule is an important parameter which, as shown in equation 1 above, will lead to an increased critical distance for FRET and so an increasing efficiency of energy transfer.

TABLE 1

| Parameter | Value |
| --- | --- |
| QD Extinction Coefficient at $\lambda_{max}$ | $2.2 \times 10^5$ $M^{-1}cm^{-1}$ |
| Dipole orientation factor, $\kappa^2$ | 2/3 |
| Refractive index | 1.7 |
| QY donor (TADF molecule) | 0.52 |
| Critical distance, $R_0$ | 4.7 nm |

From the above, a critical distance of 4.7 nm is obtained for a QD, exhibiting a maximum photoluminescence ($PL_{max}$) of 528 nm and a full-width at half-maximum (FWHM) of 39 nm, and a TADF molecule, exhibiting a $PL_{max}$ of 548 nm and a FWHM of 92 nm. One of ordinary skill in the art will readily understand the critical distance is a function of the particular QD and TADF molecule used in a system.

Maximization of QD Oscillator Strength

The oscillator strength of the band gap transition of a QD, $f_{gap}$, describes the probability of fluorescence. Thus, for two-dopant system applications it may be desirable to incorporate QDs having a high oscillator strength. In the strong quantum confinement regime, oscillator strength varies only weakly of with QD size, since the electron and hole wave functions overlap completely, independently of particle size, [M. D. Leistikow, J. Johansen, A. J. Kettelarij, P. Lodahl and W. L. Vos, *Phys. Rev. B*, 2009, 79, 045301] whereas for QDs beyond the strong quantum confinement regime the oscillator strength should increase with increasing particle size. [K. E. Gong, Y. Zeng and D. F. Kelley, *J. Phys. Chem. C*, 2013, 117, 20268].

QDs comprising a core comprising, for example, InP and emitting within the visible spectrum would have a radius well within the strong confinement regime and the oscillator strength would therefore largely be independent of particle size. In some instances, the shape of the QD may influence oscillator strength. In some instances, the QDs can be substantially spherical or ovoid. In other instances, the QDs can be substantially conical. In yet other instances, the QDs can be substantially cylindrical. In yet other instances, the QDs can be substantially rod-shaped. In yet other instances, the QDs can be in the form or nanorods, nanotubes, nanofibers, nanosheets, dendrimers, stars, tetrapods, disks, or similar physical configurations.

Increasing QD Absorption

A high QD absorption cross-section is desirable to maximise the FRET process. In quantum rods, for example the emission wavelength is controlled by the length of the short axis, and the absorption cross-section depends predominantly on volume. The absorption cross-section of a nanoparticle, $\alpha_a$, is defined in Equation 2:

$$\alpha_a(\hbar\omega) = \frac{n_b}{n}\alpha_b(\hbar\omega)|f(\hbar\omega)|^2 V$$

where $n_b$ and $\alpha_b$ are the refractive index and the absorption coefficient of the bulk semiconductor, respectively, n is the refractive index of the surrounding medium, $|f(\hbar\omega)|^2$ is the local-field factor, and V is the volume. Htoon et al. investigated the absorption cross-section of spherical (radius=2.3 nm) QDs compared with that of elongated nanoparticles, quantum rods, with the same radius but lengths of 22, 36 and 44 nm. [H. Htoon, J. A. Hollingworth, A. V. Malko, R. Dickerson and V. I. Klimov, Appl. Phys. Lett., 2003, 82, 4776]. As well as the nanorods having a larger volume, $|f(\hbar\omega)|^2$ was found to almost twice as high for randomly oriented nanorods compared to the spherical nanoparticles. $|f(\hbar\omega)|^2$ can be increased yet further for aligned nanorods. Thus, a quantum rod architecture may be advantageous over a spherical QD geometry, in terms of increasing the QD absorption cross-section.

Minimizing Excited State Lifetime

For efficient FRET, it is advantageous to minimize the excited state lifetime of QDs. Fundamentally, the excited state lifetime of a QD relates to the degree of confinement. The higher the overlap between the electron and hole, the stronger the confinement and the shorter the radiative lifetime. QD architectures that maximise the electron-hole overlap may be beneficial for two-dopant systems in electroluminescent devices. In some instances, for a given core size, increasing the shell thickness on said core decreases the excited state lifetime of the QD. However, as previously discussed, a core-shell quantum dot having a relatively thick shell may not be desirable, the distance between the TADF molecule and the QD increases with increasing shell thickness. Thus, alternative methods to manipulate the degree of confinement in the QD may be required.

In a Type I core-shell QD, an abrupt offset of the energy levels may result in strong confinement, whereas compositional grading may lead to some delocalisation of the electrons and holes. For example, the confinement in an InP/ZnS QD, consisting of an InP core (bulk band gap, $E_g$, =1.34 eV) overcoated with a ZnS shell ($E_g$=3.54 eV (cubic); 3.91 eV (hexagonal)), will be stronger than that in an InP/ZnSe core-shell QD (ZnSe $E_g$=2.82 eV). An example of a compositionally graded Type I QD would be $In_{1-x}P_{1-y}Zn_xS_y$, wherein x and y increase gradually from 0, at the centre of the QD, to 1, at the outer surface of the QD.

Where core-multishell architectures are used, the relative thicknesses of the shells may influence the degree of confinement.

For core QDs of a particular material, the smaller the QD, the higher the overlap between the electron and hole and thus the shorter the radiative lifetime. Therefore, strategies to reduce the diameter of the QD core while maintaining a specific emission wavelength may be employed. This could include alloying a first semiconductor material with a second material having a smaller band gap at a similar lattice constant. For example, an InAsP nanoparticle, made by alloying InP with InAs, can emit at 630 nm and will have a smaller diameter than an InP nanoparticle emitting at the same wavelength. Also, for example, a CdSeS nanoparticle, made by alloying CdS with CdSe, can emit at 480 nm and will have a smaller diameter than a CdS nanoparticle emitting at the same wavelength.

In some instances, nanoparticle shape can affect the excited state lifetime. For example, the radiative lifetime of prolate CdSe QDs may be slightly shorter than that of spherical CdSe nanoparticles. [K. Gong, Y. Zang and D. F. Kelley, *J. Phys. Chem. C*, 2013, 117, 20268] Thus, rod-shaped QDs, i.e. quantum rods, may offer a shorter excited state lifetime than spherical QDs. Herein, "quantum rod" is used to describe a quantum dot having lateral dimensions, x and y, and a length, z, wherein z>x,y. Alternatively, a shorter excited state lifetime may be provided by a 2-dimensional QD, wherein the quantum dot has lateral dimensions in the quantum confinement regime and a thickness between 1-5 monolayers.

Statements of the Disclosure

Statements of the Disclosure include:

Statement 1: A nanoparticle conjugate comprising a quantum dot (QD); and a thermally activated delayed fluorescence (TADF) molecule bound to the QD.

Statement 2: A nanoparticle conjugate according to Statement 1, wherein the TADF molecule is directly bound to the surface of the QD.

Statement 3: A nanoparticle conjugate according to Statement 1 or 2, wherein the TADF molecule is directly bound to the surface of the QD via an ionic bond.

Statement 4: A nanoparticle conjugate according to Statement 1 or 2, wherein the TADF molecule is directly bound to the surface of the QD via a covalent bond.

Statement 5: A nanoparticle conjugate according to Statement 1 or 2, wherein the TADF molecule is directly bound to the surface of the QD via an intermolecular force.

Statement 6: A nanoparticle conjugate according to Statement 5, wherein the intermolecular force is any one of hydrogen bonding, π-π stacking, or van der Waals forces.

Statement 7: A nanoparticle conjugate according to any one of Statements 2-6, wherein the QD further comprises a capping ligand bound to the surface of the QD.

Statement 8: A nanoparticle conjugate according to any one of Statement 1, wherein the QD further comprises a capping ligand bound to the surface of the QD.

Statement 9: A nanoparticle conjugate according to Statement 1 or 8, wherein the TADF molecule is indirectly bound to the QD.

Statement 10: A nanoparticle conjugate according to Statement 8 or 9, wherein the TADF molecule is indirectly bound to the QD via an interaction between the TADF molecule and the capping ligand.

Statement 11: A nanoparticle conjugate according to Statement 10, wherein the interaction is an ionic bond.

Statement 12: A nanoparticle conjugate according to Statement 10, wherein the interaction is a covalent bond.

Statement 13: A nanoparticle conjugate according to Statement 10, wherein the interaction is an intermolecular force.

Statement 14: A nanoparticle conjugate according to Statement 13, wherein the intermolecular force is any one of hydrogen bonding, π-π stacking, or van der Waals forces.

Statement 15: A nanoparticle conjugate according to any one of Statements 1-14, wherein the TADF molecule comprises at least one electron donor group (D group); and an electron acceptor group (A group) bound to the at least one D group.

Statement 16: A nanoparticle conjugate according to Statement 15, wherein the TADF molecule further comprises a QD binding group, the QD binding group is bound to the at least one D group, and the TADF molecule has the following general formula (I):

$$A\text{-}D\text{-}R^1 \qquad (I)$$

where $R^1$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide.

Statement 17: A nanoparticle conjugate according to Statement 15, wherein the TADF molecule comprises a QD binding group, the QD binding group is bound to the at least one D group, and the TADF molecule has the following general formula (II):

$$A\text{-}D\text{-}R^2\text{—}R^3 \qquad (II)$$

where $R^2$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^3$ is any one of a primary amine, a secondary amine, a nitroso, a nitro, a nitrile, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide.

Statement 18: A nanoparticle conjugate according to Statement 15, wherein the TADF molecule comprises a QD binding group, the QD binding group is bound to the A group, and the TADF molecule has the following general formula (III):

$$D\text{-}A\text{-}R^4 \qquad (III)$$

where $R^4$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide.

Statement 19: A nanoparticle conjugate according to Statement 15, wherein the TADF molecule comprises a QD binding group, the QD binding group is bound to the A group, and the TADF molecule has the following general formula (IV):

$$D\text{-}A\text{-}R^5\text{-}R^6 \qquad (IV)$$

where $R^5$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^6$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide.

Statement 20: A nanoparticle conjugate according to any one of Statements 1-19, wherein the QD is any one of a blue light-emitting, green light-emitting, red light-emitting, and infrared light-emitting QD.

Statement 21: A nanoparticle conjugate according to any one of Statements 1-20, wherein the QD is any one of a core QD, a core-shell QD, a core-multishell, or a quantum dot-quantum well QD.

Statement 22: A nanoparticle conjugate according to any one of Statements 1-21, wherein the QD comprises a 2-16 material, a 12-15 material, and 12-16 material, a 13-14 material, a 13-15 material, a 13-16 material, a 14-16 material, a 15-16 material, any doped material thereof, or any combination thereof.

Statement 23: A nanoparticle conjugate according to any one of Statements 1-22, wherein the TADF molecule is bound to at least two QDs.

Statement 24: An electroluminescent quantum dot-containing light-emitting diode (QD-LED) device, the QD-LED device comprising an emissive layer having a nanoparticle conjugate according to any one of Statements 1-23.

Although the present invention and its objects, features and advantages have been described in detail, other embodiments are encompassed by the invention. Finally, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A nanoparticle conjugate comprising:
a quantum dot (QD); and
a thermally activated delayed fluorescence (TADF) molecule bound to the QD, wherein the TADF molecule is directly bound to the surface of the QD, or the QD further comprises a capping ligand bound to the surface of the QD.

2. The nanoparticle conjugate of claim 1, wherein the TADF molecule is directly bound to the surface of the QD.

3. The nanoparticle conjugate of claim 2, wherein the TADF molecule is directly bound to the surface of the QD via an ionic bond.

4. The nanoparticle conjugate of claim 2, wherein the TADF molecule is directly bound to the surface of the QD via a covalent bond.

5. The nanoparticle conjugate of claim 2, wherein the TADF molecule is directly bound to the surface of the QD via an intermolecular force.

6. The nanoparticle conjugate of claim 5, wherein the intermolecular force is any one of hydrogen bonding, π-π stacking, or van der Waals forces.

7. The nanoparticle conjugate of claim 1, wherein the QD further comprises a capping ligand bound to the surface of the QD.

8. The nanoparticle conjugate of claim 7, wherein the TADF molecule is indirectly bound to the QD.

9. The nanoparticle conjugate of claim 8, wherein the TADF molecule is indirectly bound to the QD via an interaction between the TADF molecule and the capping ligand.

10. The nanoparticle conjugate of claim 9, wherein the interaction is an ionic bond.

11. The nanoparticle conjugate of claim 9, wherein the interaction is a covalent bond.

12. The nanoparticle conjugate of claim 9, wherein the interaction is an intermolecular force.

13. The nanoparticle conjugate of claim 12, wherein the intermolecular force is any one of hydrogen bonding, π-π stacking, or van der Waals forces.

14. A nanoparticle conjugate comprising:
a quantum dot (QD); and
a thermally activated delayed fluorescence (TADF) molecule bound to the QD, wherein the TADF molecule comprises: at least one electron donor group (D group), an electron acceptor group (A group) bound to the at least one D group and a QD binding group, and the TADF molecule satisfies any one of the following conditions (A)-(D):

(A) the QD binding group is bound to the at least one D group, and the TADF molecule has the following general formula (I):

$$\text{A-D-R}^1 \tag{I}$$

where $R^1$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide;

(B) the QD binding group is bound to the at least one D group, and the TADF molecule has the following general formula (II):

$$\text{A-D-R}^2\text{—R}^3 \tag{II}$$

where $R^2$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^3$ is any one of a primary amine, a secondary amine, a nitroso, a nitro, a nitrile, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide;

(C) the QD binding group is bound to the A group, and the TADF molecule has the following general formula (III):

$$\text{D-A-R}^4 \tag{III}$$

where $R^4$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide; and (D) the QD binding group is bound to the A group, and the TADF molecule has the following general formula (IV):

$$\text{D-A-R}^5\text{—R}^6 \tag{IV}$$

where $R^5$ comprises any one of an substituted or unsubstituted $C_1$-$C_{24}$ alkyl chain, one or more of a substituted or an unsubstituted $C_3$-$C_{18}$ cycloalkyl, aryl or heteroaryl group, and $R^6$ is any one of a primary amine, a secondary amine, a nitrile, a nitroso, a nitro, a thiol, a phosphine, a phosphine oxide, an alkyl phosphonic acid, a hydroxyl, a ketone, an aldehyde, an ether, an ester, an epoxide, a carboxylate salt, a carboxylate ester, a carboxylic acid, a fluorine, a fluoroalkyl, a fluoroaryl, a sulfone, or a sulfoxide.

15. The nanoparticle conjugate of claim 14, wherein the TADF molecule satisfies the condition (A).

16. The nanoparticle conjugate of claim 14, wherein the TADF molecule satisfies the condition (B).

17. The nanoparticle conjugate of claim 14, wherein the TADF molecule satisfies the condition (C).

18. The nanoparticle conjugate of claim 14, wherein the TADF molecule satisfies the condition (D).

19. An electroluminescent quantum dot-containing light-emitting diode (QD-LED) device, the QD-LED device comprising an emissive layer having a nanoparticle conjugate according to claim 1.

* * * * *